(12) United States Patent
Sumitomo et al.

(10) Patent No.: US 8,815,701 B2
(45) Date of Patent: Aug. 26, 2014

(54) METHOD FOR MANUFACTURING SEMICONDUCTOR DEVICE HAVING SOI SUBSTRATE

(75) Inventors: Masakiyo Sumitomo, Okazaki (JP); Makoto Asai, Anjo (JP); Nozomu Akagi, Nukata-gun (JP); Yasuhiro Kitamura, Chiryu (JP); Hiroki Nakamura, Handa (JP); Tetsuo Fujii, Toyohashi (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 13/546,040

(22) Filed: Jul. 11, 2012

(65) Prior Publication Data
US 2012/0302036 A1 Nov. 29, 2012

Related U.S. Application Data

(62) Division of application No. 12/289,773, filed on Nov. 4, 2008, now Pat. No. 8,278,731.

(30) Foreign Application Priority Data

Nov. 20, 2007 (JP) .................................. 2007-300364
Sep. 16, 2008 (JP) .................................. 2008-236452

(51) Int. Cl.
| | |
|---|---|
| *H01L 21/762* | (2006.01) |
| *H01L 27/12* | (2006.01) |
| *H01L 27/06* | (2006.01) |
| *H01L 21/8234* | (2006.01) |
| *H01L 27/02* | (2006.01) |
| *H01L 21/84* | (2006.01) |
| *H01L 29/06* | (2006.01) |
| *H01L 29/78* | (2006.01) |
| *H01L 21/265* | (2006.01) |

(52) U.S. Cl.
CPC .... *H01L 21/823481* (2013.01); *H01L 27/1203* (2013.01); *H01L 27/0629* (2013.01); *H01L 29/0653* (2013.01); *H01L 29/7813* (2013.01); *H01L 21/76264* (2013.01); *H01L 21/76243* (2013.01); *H01L 29/0634* (2013.01); *H01L 27/0251* (2013.01); *H01L 21/84* (2013.01); *H01L 21/823487* (2013.01); *H01L 21/26533* (2013.01)
USPC .......................................... 438/423; 438/424

(58) Field of Classification Search
USPC .......................... 438/423, 424; 257/E21.546
See application file for complete search history.

(56) References Cited

U.S. PATENT DOCUMENTS

| 4,578,600 A | 3/1986 | Magee |
|---|---|---|
| 5,349,224 A | 9/1994 | Gilbert et al. |

(Continued)

FOREIGN PATENT DOCUMENTS

| JP | A-58-222553 | 12/1983 |
|---|---|---|
| JP | A-60-111450 | 6/1985 |

(Continued)

OTHER PUBLICATIONS

Notice of Reason for Refusal issued from the Japanese Patent Office on Jan. 6, 2010 in the corresponding Japanese patent application No. 2008-236452 (with English translation).

*Primary Examiner* — Long K Tran
*Assistant Examiner* — Jordan Klein
(74) *Attorney, Agent, or Firm* — Posz Law Group, PLC

(57) ABSTRACT

A semiconductor device includes: a SOI substrate including a support layer, a first insulation film and a SOI layer; a first circuit; a second circuit; and a trench separation element. The SOI substrate further includes a first region and a second region. The first region has the support layer, the first insulation film and the SOI layer, which are stacked in this order, and the second region has only the support layer. The trench separation element penetrates the support layer, the first insulation film and the SOI layer. The trench separation element separates the first region and the second region. The first circuit is disposed in the SOI layer of the first region. The second circuit is disposed in the support layer of the second region.

4 Claims, 21 Drawing Sheets

(56) References Cited

U.S. PATENT DOCUMENTS

| | | |
|---|---|---|
| 5,525,824 A | 6/1996 | Himi et al. |
| 5,650,354 A | 7/1997 | Himi et al. |
| 6,087,892 A | 7/2000 | Burr |
| 6,603,807 B1 | 8/2003 | Yukutake et al. |
| 6,727,146 B2 | 4/2004 | Murakami et al. |
| 6,737,332 B1 * | 5/2004 | Fuselier et al. ............... 438/423 |
| 6,835,981 B2 | 12/2004 | Yamada et al. |
| 6,953,728 B2 | 10/2005 | Murakami et al. |
| 7,018,904 B2 | 3/2006 | Yamada et al. |
| 7,049,661 B2 * | 5/2006 | Yamada et al. ............... 257/347 |
| 7,095,081 B2 | 8/2006 | Yamada et al. |
| 7,132,702 B2 | 11/2006 | Narui et al. |
| 7,148,543 B2 | 12/2006 | Yamada et al. |
| 7,323,748 B2 | 1/2008 | Yamada et al. |
| 7,719,077 B2 | 5/2010 | Kohlmann Von-Platen et al. |
| 7,816,228 B2 | 10/2010 | Kim et al. |
| 8,125,002 B2 | 2/2012 | Fukuda et al. |
| 2001/0054723 A1 | 12/2001 | Narui et al. |
| 2002/0045360 A1 | 4/2002 | Murakami et al. |
| 2003/0169808 A1 | 9/2003 | Yukutake et al. |

FOREIGN PATENT DOCUMENTS

| | | |
|---|---|---|
| JP | A-08-181211 | 7/1996 |
| JP | A-2001-274234 | 10/2001 |
| JP | A-2003-347523 | 12/2003 |
| JP | 2007317839 A * | 12/2007 |
| JP | A-2007-317839 | 12/2007 |
| WO | WO 2004/053993 A1 | 6/2004 |

* cited by examiner

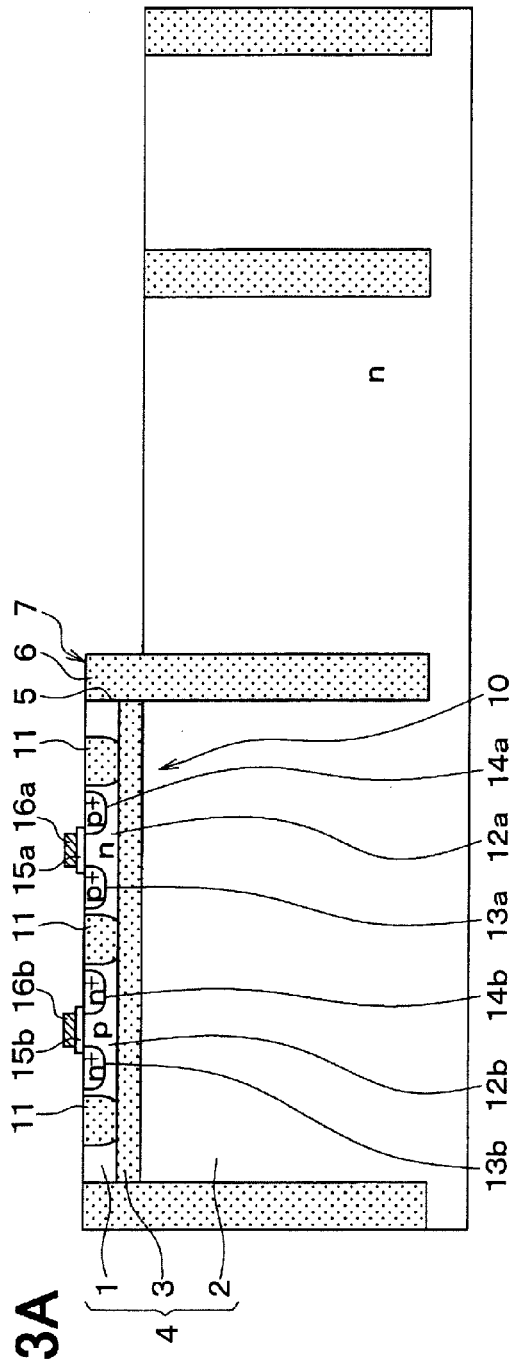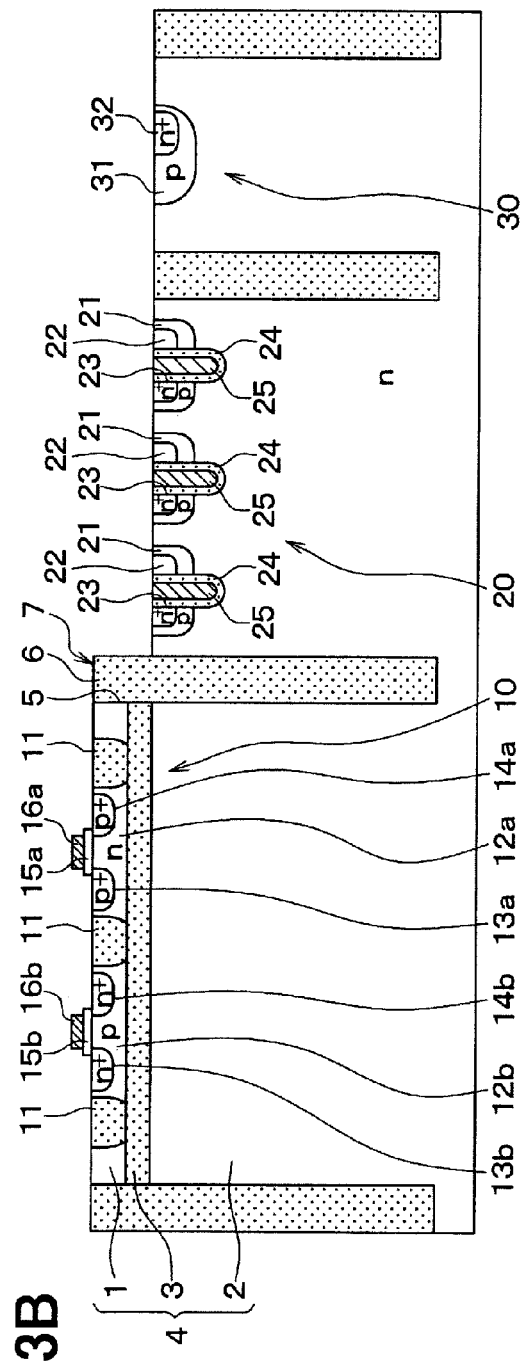
FIG. 3A
FIG. 3B

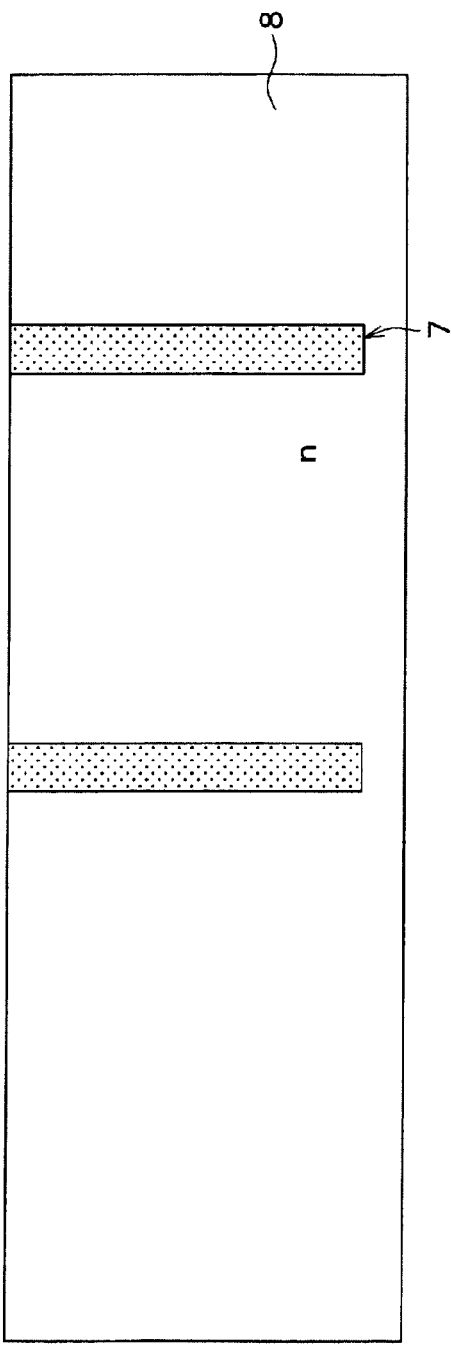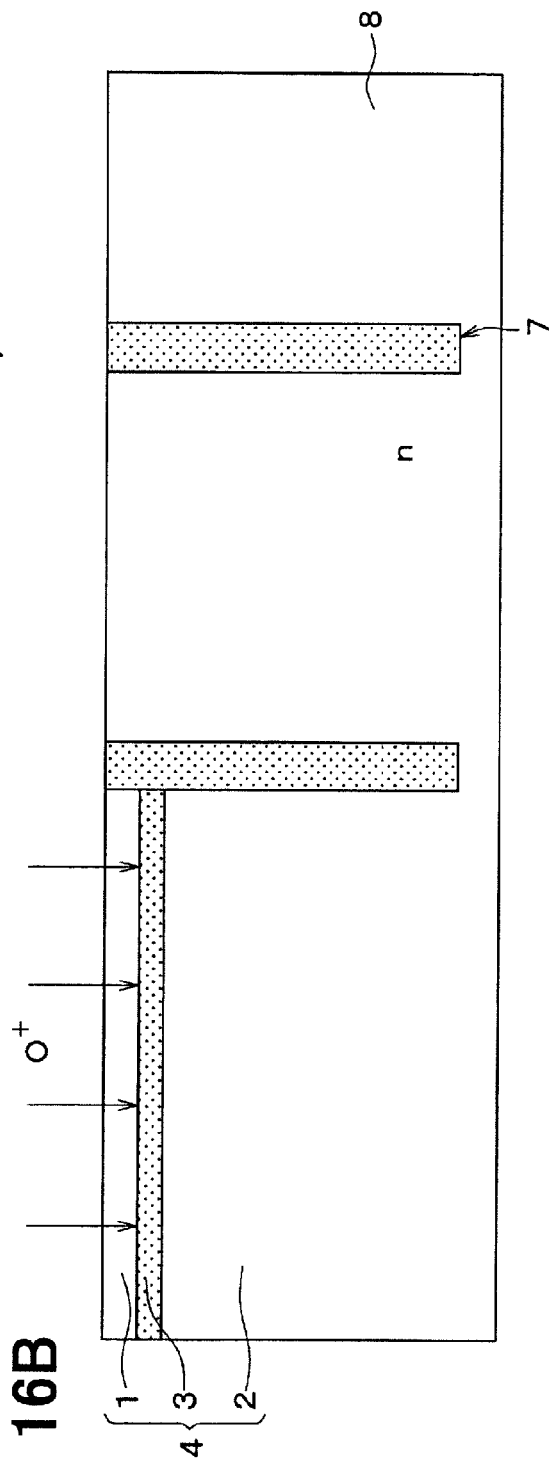

METHOD FOR MANUFACTURING SEMICONDUCTOR DEVICE HAVING SOI SUBSTRATE

CROSS REFERENCE TO RELATED APPLICATIONS

This application is a divisional of U.S. application Ser. No. 12/289,773 filed on Nov. 4, 2008 now U.S. Pat. No. 8,278,731, allowed on Jun. 11, 2012, which is based on and claims priority to Japanese Patent Applications No. 2007-300364 filed on Nov. 20, 2007, and No. 2008-236452 filed on Sep. 16, 2008, the disclosures of which are incorporated herein by reference.

FIELD OF THE INVENTION

The present invention relates to a semiconductor device having a SOI substrate and a method for manufacturing a semiconductor device having a SOI substrate.

BACKGROUND OF THE INVENTION

Recently, an in-vehicle equipment or an industrial robot become highly functionally. A system performs to drive an actuator and to operate an air bag device based on an output corresponding to calculation result of data such as an image, a sound and an acceleration obtained from signals of various sensors. A semiconductor device is used for the system, and formed of one chip device. The device includes many kinds of electric elements, which are separated from each other with junction isolation and/or oxide film isolation. The device is defined as a composite device, which is disclosed in, for example, JP-A-H08-181211.

An element isolation structure for providing the composite device is the junction isolation structure or the oxide film isolation structure. In the junction isolation structure, a PN junction surrounds an element so that the element is isolated. In the oxide film isolation structure, an oxide film is formed in a trench, which is formed on a SOI layer of a SOI substrate and reaches an embedded oxide film, so that an element is isolated with the oxide film. The oxide film isolation structure has surge resistance higher than the junction isolation structure since the oxide film isolation structure has no parasitic element. Further, the dimensions of the oxide film isolation structure are smaller than those of the junction isolation structure.

However, since the composite device includes various circuits, it is necessary to thicken the thickness of the SOI layer. For example, when a logic circuit and a high power circuit are formed in the same substrate, it is necessary to increase the thickness of the SOI layer for securing a breakdown voltage of the high power circuit. Here, the logic circuit includes a CMOS for performing calculation, and the high power circuit includes a diode for protecting from ESD (i.e., electro static discharge) and a LDMOS for handling high power, i.e., high voltage electricity. Accordingly, in the logic circuit, a well layer is formed in the thick SOI layer, and an element is formed in the well layer. Thus, a parasitic capacitor is formed at a boundary of the well layer, and the parasitic capacitance is not sufficiently small. The energy consumption increases, and calculation speed decreases.

Thus, it is required for a composite device to be formed of one chip device, and to reduce the thickness of the SOI layer even when the composite device includes a signal processor and a high power circuit.

SUMMARY OF THE INVENTION

In view of the above-described problem, it is an object of the present disclosure to provide a semiconductor device having a SOI substrate. It is another object of the present disclosure to provide a method for manufacturing a semiconductor device having a SOI substrate.

According to a first aspect of the present disclosure, a semiconductor device includes: a SOI substrate including a support layer, a first insulation film and a SOI layer; a first circuit; a second circuit; and a trench separation element. The SOI substrate further includes a first region and a second region. The first region has the support layer, the first insulation film and the SOI layer, which are stacked in this order, and the second region has only the support layer. The trench separation element penetrates the support layer, the first insulation film and the SOI layer. The trench separation element separates the first region and the second region. The first circuit is disposed in the SOI layer of the first region. The second circuit is disposed in the support layer of the second region.

In the above device, the first and second circuits are mounted in one chip without thickening the SOI layer.

According to a second aspect of the present disclosure, a method for manufacturing a semiconductor device includes: bonding a SOI layer, a first insulation layer and a support layer to provide a SOI substrate; forming a trench in the SOI substrate to penetrate the SOI layer and the first insulation film and to reach the support layer; filling the trench with a second insulation film to provide a trench separation element, wherein the trench separation element divides the SOI substrate into a first region and a second region; forming a first circuit in the SOI layer of the first region; removing the SOI layer and the first insulation film in the second region; and forming a second circuit in the support layer of the second region.

The above method provides the semiconductor device, in which the first and second circuits are mounted in one chip without thickening the SOI layer.

According to a third aspect of the present disclosure, a method for manufacturing a semiconductor device includes: implanting an oxygen ion into a silicon substrate as a bulk substrate; heating the silicon substrate to form an insulation film at a predetermined depth of the silicon substrate so that a SOI layer, the first insulation film and a silicon support layer provide a partial SOI substrate, wherein the partial SOI substrate includes a first region and a second region, and the first region includes the SOI layer, the first insulation film and the silicon support layer, and the second region includes only the silicon support layer; forming a trench in the partial SOI substrate to penetrate the SOI layer and the first insulation film and to reach the silicon support layer, wherein the trench is disposed between the first region and the second region; filling the trench with a second insulation film to provide a trench separation element, wherein the trench separation element divides the partial SOI substrate into the first region and the second region; forming a first circuit in the SOI layer of the first region; and forming a second circuit in the support layer of the second region.

The above method provides the semiconductor device, in which the first and second circuits are mounted in one chip without thickening the SOI layer.

BRIEF DESCRIPTION OF THE DRAWINGS

The above and other objects, features and advantages of the present invention will become more apparent from the following detailed description made with reference to the accompanying drawings. In the drawings:

FIGS. 3A and 3B are diagrams illustrating the method for manufacturing the semiconductor device;

FIGS. 16A and 16B are diagrams illustrating a method for manufacturing the semiconductor device according to the tenth embodiment;

DETAILED DESCRIPTION OF THE PREFERRED EMBODIMENTS

First Embodiment

Figure 1:
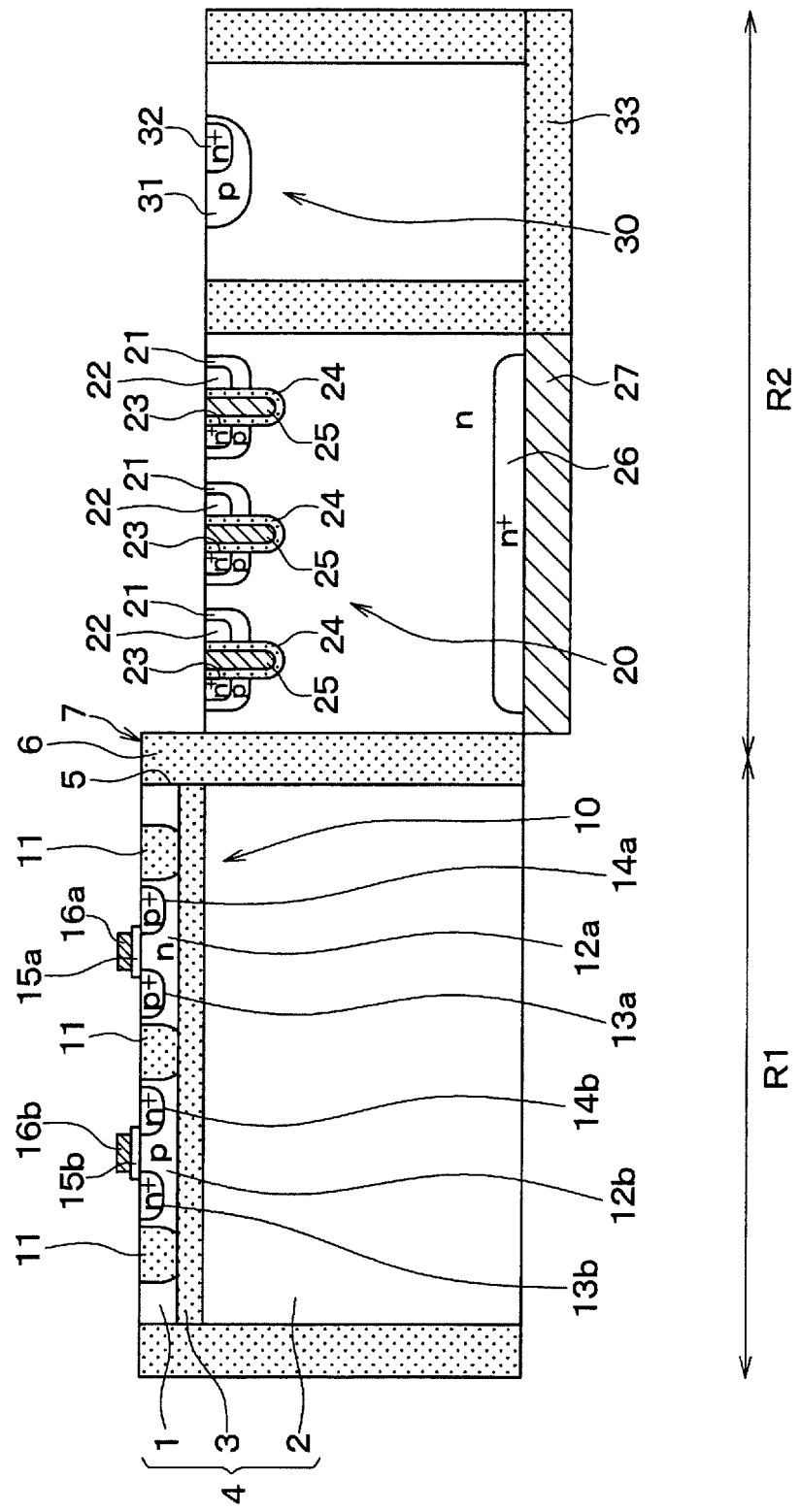
FIG. 1 is a diagram illustrating a cross sectional view of a semiconductor device according to a first embodiment.

FIG. 1 shows a semiconductor device according to a first embodiment. Here, an upper side of the drawing of FIG. 1 represents a foreside of the device, and a lower side of the drawing of FIG. 1 represents a backside of the device.

The device is formed of a SOI substrate 4 having a SOI layer 1, an embedded oxide film 3 and a support layer 2, which are stacked in this order. The SOI layer 1 is made of N conductive type silicon, and the embedded oxide film 3 provides a BOX (i.e., buried oxide) film.

The SOI layer 1 is disposed on the foreside of the device, and formed by grinding a silicon substrate so that a thickness of the SOI layer 1 is in a range between 10 nm and 10 μm. A signal processing circuit such as a logic circuit driven by small electricity is formed in the SOI layer 1. A region, in which the signal processing circuit is formed, is defined as a low power circuit portion R1.

The low power circuit portion R1 is separated from other portions with a trench separation portion 7 so that an element in the low power circuit portion R1 is separated from other elements in the other portions. The trench separation portion 7 provides element separation or element isolation. The trench separation portion 7 includes a trench 5 and an insulation film 6 in the trench 5. Various elements for forming the signal processing circuit such as a CMOS transistor 10 is disposed in the low power circuit portion R1. Specifically, element isolation is provided by an insulation film 11 such as a STI (i.e., shallow trench isolation) film and a LOCOS oxide film. The insulation film 11 divides the SOI layer 1 into multiple regions. Each region isolated from each other includes a N conductive type well layer (i.e., N well layer) 12a or a P conductive type well layer (i.e., P well layer) 12b. A $P^+$ conductive type source region 13a and a $P^+$ conductive type drain region 14a are formed in the N well layer 12a. An $N^+$ conductive type source region 13b and a $N^+$ conductive type drain region 14b are formed in the P well layer 12b. A gate electrode 16a is formed on a part of the surface of the N well layer 12a via a gate insulation film 15a, and the part of the N well layer 12a is disposed between the $P^+$ source region 13a and the $P^+$ drain region 14a. Another gate electrode 16b is formed on a part of the surface of the P well layer 12b via a gate insulation film 15b, and the part of the P well layer 12b is disposed between the $N^+$ source region 13b and the $N^+$ drain region 14b. Thus, the CMOS transistor device 10 is provided by a N channel MOSFET and a P channel MOSFET.

The gate electrodes 16a, 16b, a wiring (not shown) for connecting to the source regions 13a, 13b and the drain regions 14a, 14b, and an interlayer insulation film (not shown) are formed on a surface portion of the SOI layer 1. A bipolar transistor (not shown), a diffusion resistor (not shown), a memory (not shown) and the like are formed in the surface portion of the SOI layer 1. Only the CMOS transistor 10 as an example is shown in FIG. 1.

The other portion R2 of the low power circuit portion R1 in the SOI substrate 4 does not include the SOI layer 1 and the embedded oxide film 3, which are removed from the SOI substrate 4. Thus, the support layer 2 is exposed on the foreside of the device. A step is formed between the other portion R2 and the low power circuit portion R1. The step is equal to thickness of the SOI layer 1 and the embedded oxide film 3. The other portion R2, in which the support layer 2 is exposed on the foreside of the device, is defined as a high power circuit portion R2. Various high power elements are formed in the high power circuit portion R2.

The high power circuit portion R2 is also isolated with the trench separation portion 7 including the trench 5 and the insulation film 6. The high power circuit portion R2 is separated into multiple regions. In FIG. 1, the high power circuit portion R2 is separated into twp regions with the trench separation portion 7, and a power MOSFET transistor 20 is formed in a first region, and a protection diode 30 is formed in a second region. The power MOSFET transistor 20 has a trench gate structure.

The power MOSFET transistor 20 is a vertical type high power element so that current flows from the foreside of the support layer 2 to the backside of the support layer 2. A P conductive type base region 21 is formed in the surface portion of the support layer 2 in the first region of the high power circuit portion R2. A $N^+$ conductive type source region 22 is formed in the base region 21 such that the source region 22 is terminated in the base region 21. A trench 23 is formed to penetrate the source region 22 and the base region 21 and to reach the support layer 2. A gate insulation film 24 is formed on an inner wall of the trench 23, and a gate electrode 25 is embedded in the trench 23 via the gate insulation film 24. Thus, the gate electrode 25 is disposed on a surface of the gate insulation film 24. A $N^+$ conductive type drain region 26 is formed on the backside of the support layer 2. Further, a drain electrode 27 is formed to electrically connect to the drain region 26. The connection between the drain electrode 27 and the drain region 26 is ohmic contact. Thus, the power MOSFET transistor is formed.

The gate electrode 25, a wiring (not shown) for connecting to the $N^+$ conductive type source region 22 and the base region 21, and an interlayer insulation film (not shown) are formed on the foreside of the support layer 2.

A P conductive type anode layer 31 and a N conductive type cathode layer 32 are formed in a surface portion of the support layer in the second region of the high power circuit portion R2. The protection diode 30 is disposed in the second region. The N conductive type cathode layer 32 is disposed in the P conductive type anode layer 31 such that the cathode layer 32 is terminated in the anode layer 31. The anode layer 31 and the cathode layer 32 provide a PN junction of the protection diode 30. The diode 30 is a lateral type element so that current flows in a direction in parallel to the surface of the device. An insulation film 33 covers a part of the backside of the support layer 2 in the second region of the high power circuit portion R2.

The cathode layer 32, the anode layer 31, a wiring (not shown) for connecting to the cathode layer 32 and the anode layer 31, and an interlayer insulation film (not shown) are formed in the surface portion of the protection diode 30.

The above device includes the SOI substrate 4, which has the low power circuit portion R1 in the SOI layer 1 and the high power circuit portion R2 in the support layer 2.

Accordingly, the thickness of the SOI layer 1 is determined in view of formation of the low power circuit portion R1 without considering physical properties of the high power circuit portion R2 such as break down voltage. In the device, the well layer 12a, 12b have no boundary in the SOI layer 1, compared with a case where a well layer is formed in a thick SOI layer. Accordingly, a parasitic capacitor is not formed between the well layer 12a, 12b and the SOI layer 1. Further, the device prevents from increasing energy consumption caused by the parasitic capacitor, and from decreasing calculation speed.

Since the high power circuit portion R2 is formed in the support layer 2, which has sufficient thickness, breakdown voltage and the like of elements in the high power circuit portion R2 are sufficiently large.

Thus, the low power circuit portion R1 including the signal processing circuit and the high power circuit portion R2 including the power MOSFET transistor 20 are integrated into one chip. Further, the thickness of the SOI layer 1 is limited.

The manufacturing method of the semiconductor device will be explained with reference to FIGS. 2A to 4B.

Figure 2A:
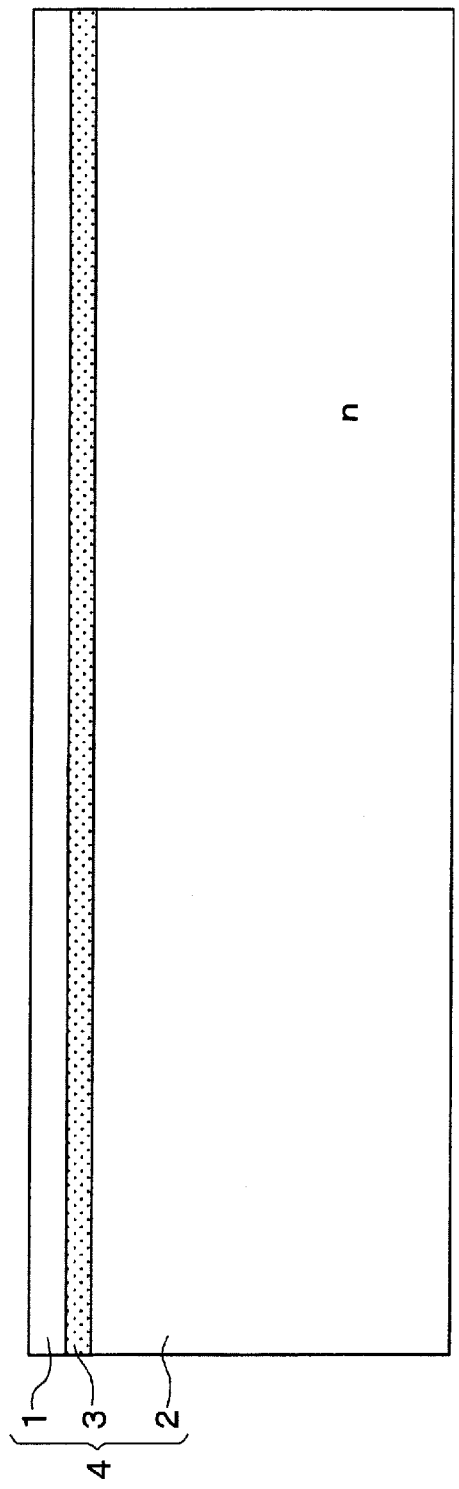
FIGS. 2A and 2B are diagrams illustrating a method for manufacturing the semiconductor device according to the first embodiment.

In FIG. 2A, the SOI substrate 4 is prepared. The SOI layer 1 made of N conductive type silicon, the embedded oxide film 3 and the support layer 2 are stacked and bonded in this order so that the SOI substrate 4 is prepared. A method for forming the substrate 4 is well know.

Figure 2B:
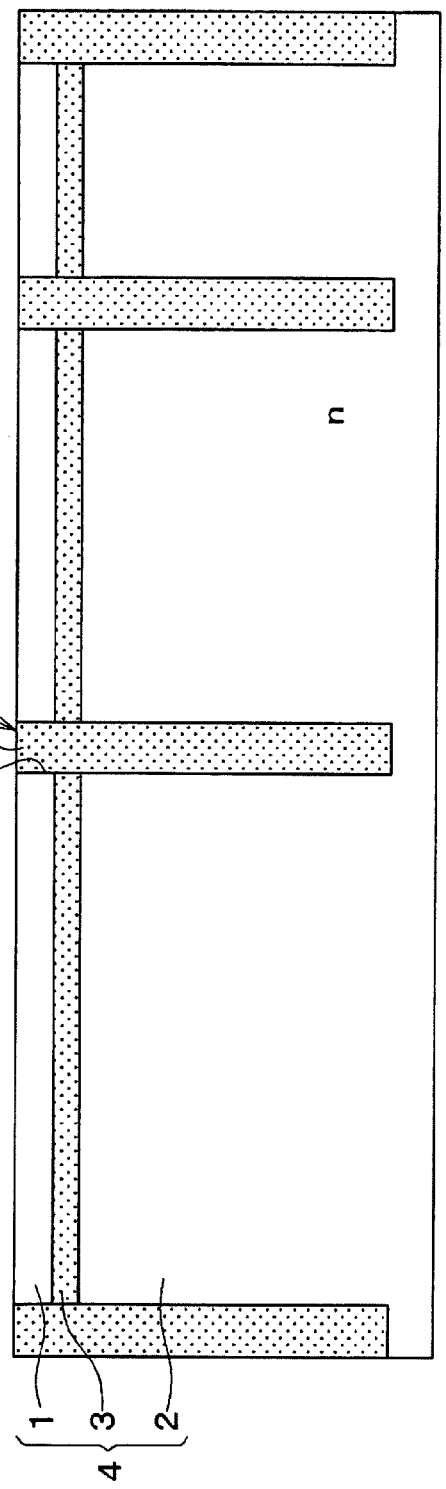

In FIG. 2B, the trench 5 is formed in the SOI substrate 4. For example, a mask made of a photo resist, a silicon oxide film or a silicon nitride film is formed on the surface of the SOI layer 1. Then, a part of the SOI layer 1 is opened, the part to be the trench 5. The SOI layer 1, the embedded oxide film 3 and the support layer 3 are etched with using the mask such that the opening reaches the support layer 3. Specifically, the trench 5 reaches a middle of the support layer 3 so that the trench 5 does not penetrate the support layer 3. In this case, it is necessary to switch etchant between a step for etching the SOI layer 1 and the support layer 2 made of silicon and a step for etching the embedded oxide film 3 made of an insulation film such as a silicon oxide film. Then, the device is heated and oxidized so that the thermal oxide film is formed on the inner wall of the trench 5. A poly silicon film is formed on the surface of the thermal oxide film so that the oxide film is embedded in the trench 5. After that, the poly silicon film and the mask formed on the foreside of the SOI layer 1 are removed by a CMP grinding method. Thus, the trench separation portion 7 having the insulation film 6 in the trench 5 is formed.

In FIG. 3A, the signal processing circuit including the CMOS transistor 10 is formed in a predetermined part of the SOI layer 1 by a conventional method including, for example, an element isolation step performed by a STI method, a forming step of the N conductive type well layer 12a and the P conductive type well layer 12b performed by an ion implantation method and an activation thermal method, a forming step of the source regions 13a, 13b and the drain regions 14a, 14b performed by an ion implantation method and an activation thermal method, a forming step of the gate insulation film 15 performed by a thermal oxidation method, and a forming step of the gate electrodes 16a, 16b including a deposition process of a doped poly silicon film and a patterning process. Thus, the low power circuit portion R1 is formed.

After a mask is formed to cover the low power circuit portion R1, a part of the SOI layer 1 and the embedded oxide film 3 is removed by etching so that the high power circuit portion R2 is prepared. The support layer 2 in the high power circuit portion R2 is exposed to the foreside of the device.

In FIG. 3B, a trench gate structure of the power MOSFET transistor and a PN junction of the protection diode 30 are formed in a surface portion of the support layer 2 in the high power circuit portion R2 by a conventional method including, for example, a forming step of the P conductive type base region 21, the $N^+$ conductive type source region 22, the P conductive type anode layer 31 and the N conductive type cathode layer 32 performed by an ion implantation method and an activation thermal method, a forming step of the trench 23, a forming step of the gate insulation film 24 including a thermal oxidation process and a stacking process of a silicon nitride film, and a forming step of the gate electrode 25 including an embedding process of a doped poly silicon film and an etch back process.

Figure 4A:
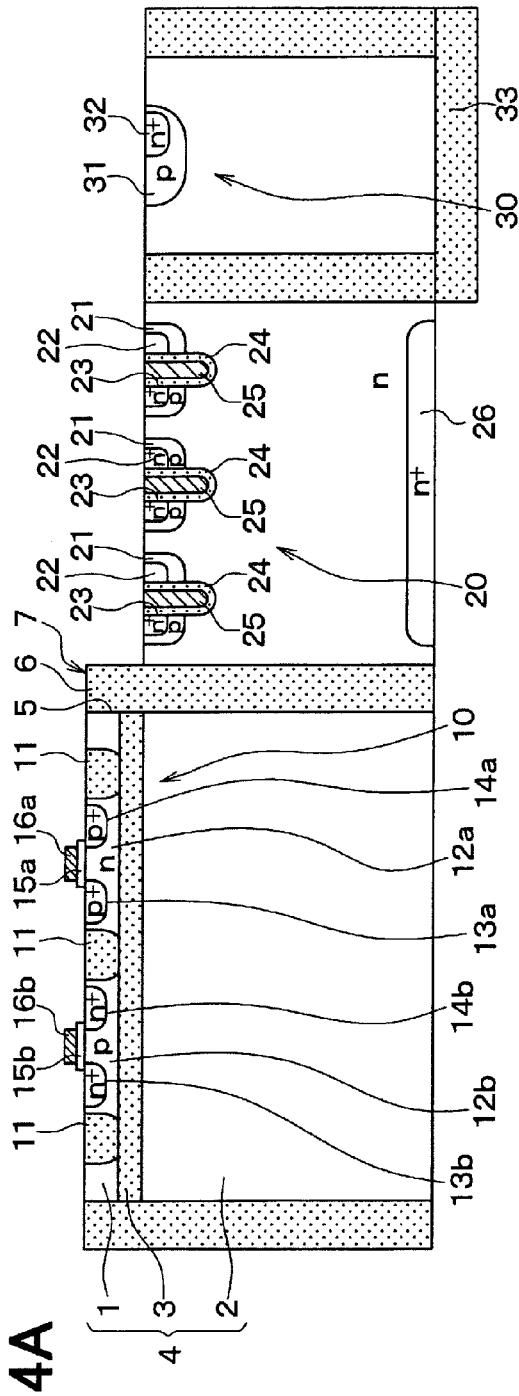
FIGS. 4A and 4B are diagrams illustrating the method for manufacturing the semiconductor device.

In FIG. 4A, the backside of the support layer 2 turns up, and the backside of the support layer 2 is ground by a CMP grinding method so that the trench separation portion 7 is exposed on the backside of the support layer 2. Then, a N conductive type impurity is implanted on the backside of the support layer 2. After that, the device is thermally activated in a thermal activation process so that the $N^+$ conductive type drain region 26 is formed. Thus, the insulation film 33 is deposited on the backside of the support layer 2, and patterned to remain only the backside of the protection diode 30.

Figure 4B:
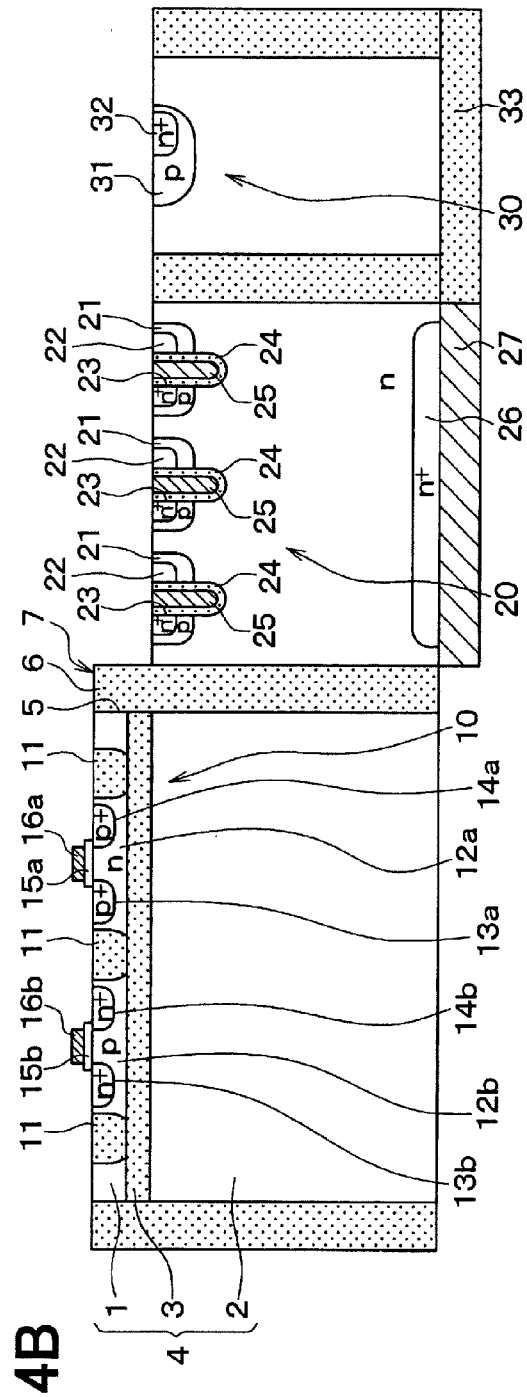

In FIG. 4B, an electrode layer made of aluminum or the like is deposited on the backside of the support layer 2, and patterned so that the drain electrode 27 is formed on the backside of the power MOSFET transistor 20.

Then, a forming step of the interlayer insulation film, a forming step of the wiring, and a forming step of a protection film are executed, so that the semiconductor device is completed.

The semiconductor device includes the SOI substrate 4, the low power circuit portion R1 is formed in the SOI layer 1, and the high power circuit portion R2 is formed in the support layer 1. Thus, the low power circuit portion R1 and the high power circuit portion R2 are integrated into one chip, and the thickness of the SOI layer 1 is comparatively small.

Second Embodiment

In a second embodiment, the device includes multiple power MOSFET transistors 20 and multiple protection diodes 30, which are separated and isolated from each other.

Figure 5:
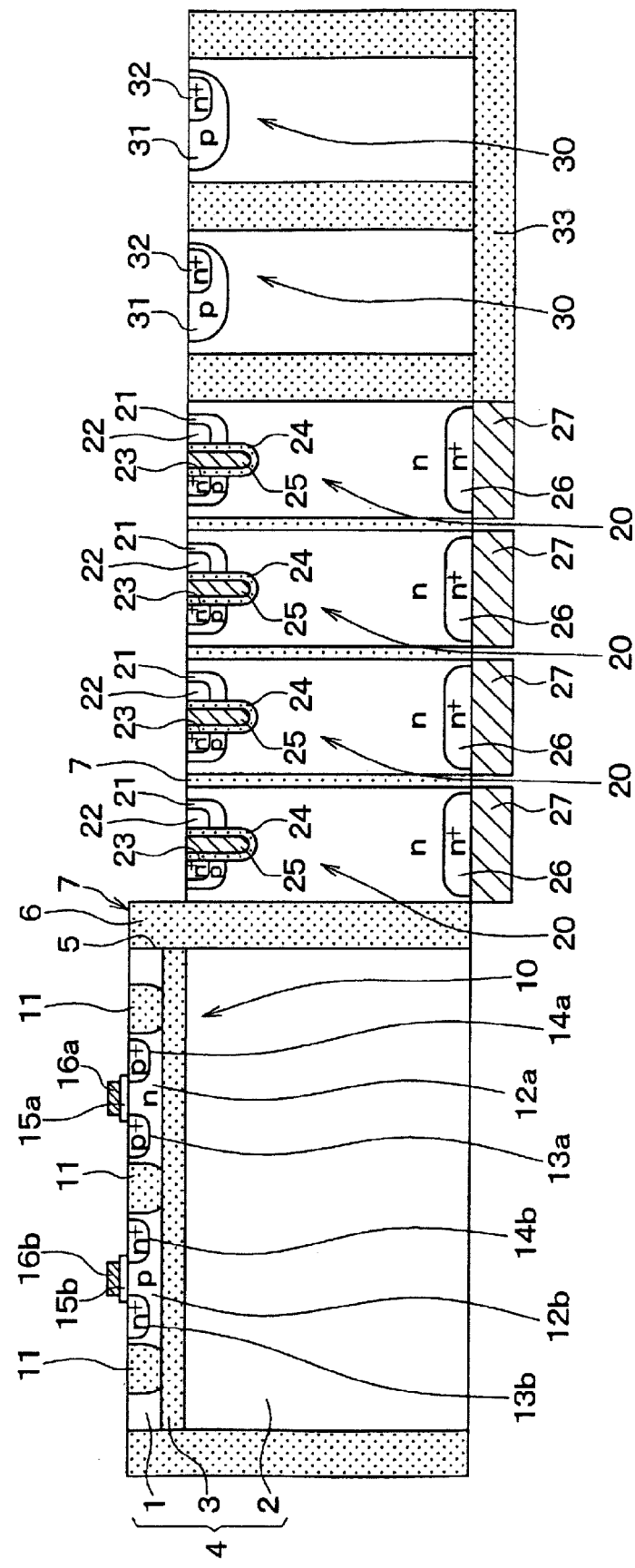
FIG. 5 is a diagram illustrating a cross sectional view of a semiconductor device according to a second embodiment.

FIG. 5 shows the device according to the second embodiment. Each power MOSFET transistor 20 is disposed in a corresponding cell. The cells are separated with the trench separation portion 7. Specifically, each cell includes multiple N$^+$ conductive type drain regions 26 and multiple drain electrodes 27. Further, each protection diode 30 is disposed in a corresponding cell, and the cells are separated from each other.

Thus, multiple power MOSFET transistors 20 and multiple protection diodes 30 are separated and isolated from each other. The power MOSFET transistor 20 includes multiple drain electrodes 27, so that the power MOSFET transistor 20 provides a multi-channel device.

The above device is manufactured by using a mask having a different pattern in the step of forming the trench separation portion 7, using a mask having a different pattern in the step of forming the N$^+$ conductive type drain region 26 and the drain electrode 27.

Third Embodiment

In a third embodiment, a threshold value of the CMOS transistor 10 in the low power circuit portion R1 is adjusted.

Figure 6:
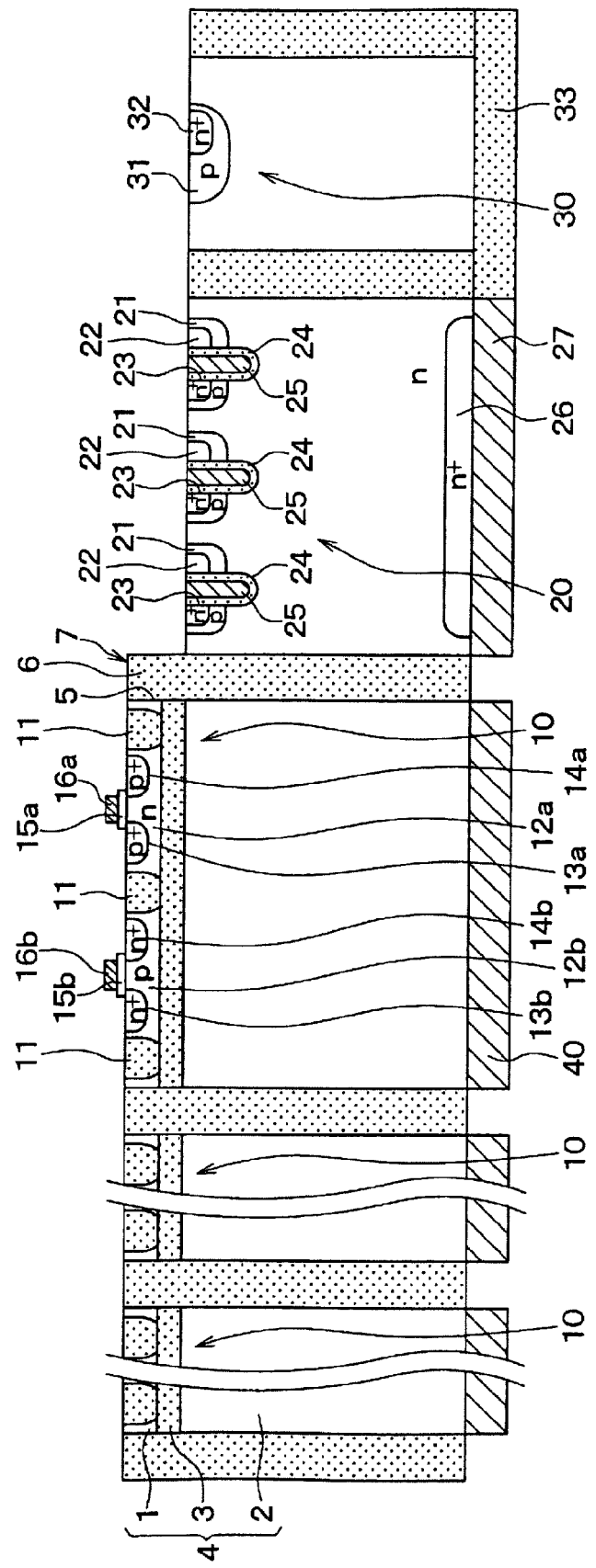
FIG. 6 is a diagram illustrating a cross sectional view of a semiconductor device according to a third embodiment.

FIG. 6 shows a semiconductor device according to the third embodiment. A threshold control electrode 40 is formed on the backside of the support layer 2 in the low power circuit portion R1 such that the threshold control electrode 40 correspond to and is opposite to the CMOS transistor 10. FIG. 6 shows a case where multiple CMOS transistors 10 are formed in the low power circuit portion R1. The CMOS transistors 10 are separated from each other with the trench separation portion 7. Further, each CMOS transistor 10 has the threshold control electrode 40. Here, in FIG. 6, two CMOS transistors 10 disposed on the left side of the drawing are not shown.

The threshold control electrode 40 controls an electric potential to be applied to the support layer 2, which corresponds to the opposite side of the CMOS transistor 10. Thus, the operation threshold of the CMOS transistor 10 is controlled. When the operation threshold of the CMOS transistor 10 is set to be low, the CMOS transistor 10 functions with high speed. The specific values of the CMOS transistor 10 are adjusted to be predetermined values.

A step for forming the threshold control electrode 40 may be performed together with the step for forming the drain electrode 27. Thus, the device shown in FIG. 6 is manufactured without adding a step for the threshold control electrode 40 in the manufacturing steps shown in FIGS. 2A to 4B.

Fourth Embodiment

In a semiconductor device according to a fourth embodiment, the threshold of the CMOS transistor 10 in the low power circuit portion R1 is controlled.

Figure 7:
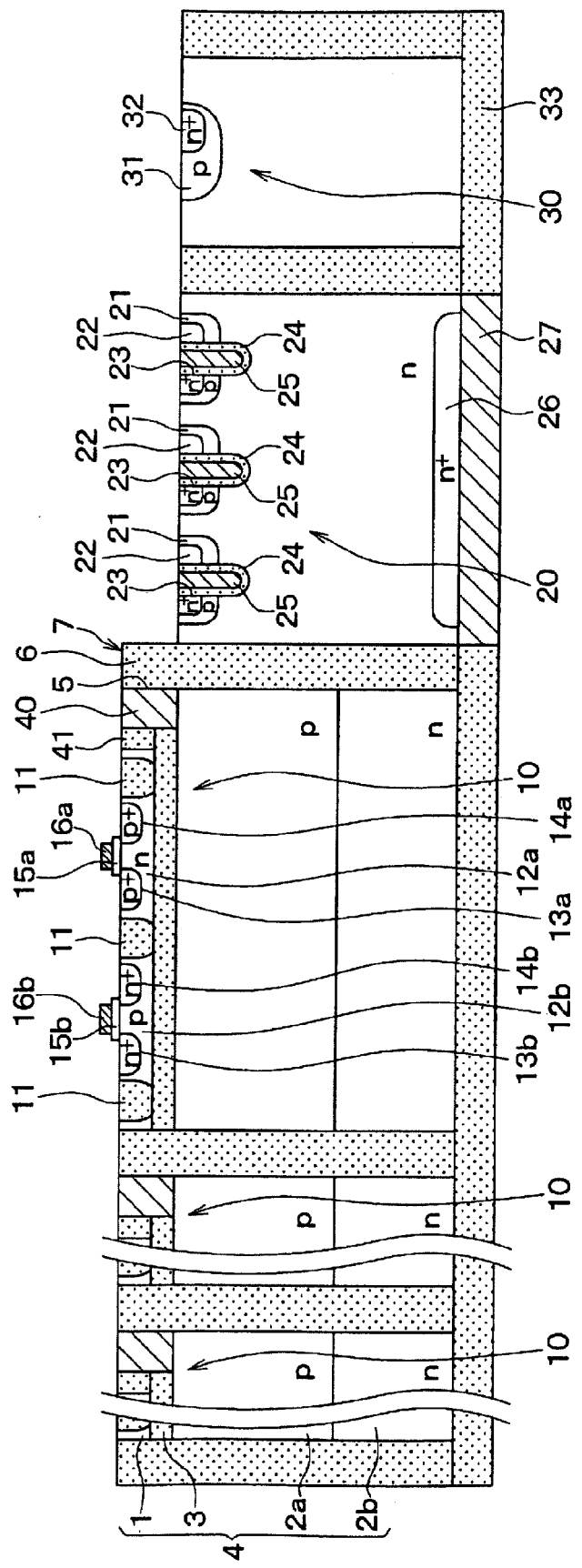
FIG. 7 is a diagram illustrating a cross sectional view of a semiconductor device according to a fourth embodiment.

FIG. 7 shows the device according to the fourth embodiment. Multiple CMOS transistors 10 are formed in the low power circuit portion R1. The CMOS transistors 10 are separated from each other with the trench separation portion 7. The SOI layer 1 and the embedded oxide film 3 are partially removed around each CMOS transistor 10. The threshold control electrode 40 is formed on the support layer 2 at a place where the SOI layer 1 and the embedded oxide film 3 are removed. The threshold control electrode 40 is electrically connected to the support layer 2. An insulation film 41 is formed between the CMOS transistor 10 and the threshold control electrode 40 so that the CMOS transistor 10 is isolated from the threshold control electrode 40. Here, in FIG. 7, two CMOS transistors 10 disposed on the left side of the drawing are not shown.

In the low power circuit portion R1, the support layer 2 includes an upper layer 2a and a lower layer 2b. The upper layer 2a is a P conductive type layer 2a, and the lower layer 2b is a N conductive type layer 2b so that the upper and lower layers 2a, 2b provide a PN junction. Further, the backside of the support layer 2 in the low power circuit portion R1 is covered with an insulation film 33.

The threshold control electrode 40 disposed on the foreside of the device is electrically connected to the support layer 2 so that the operation threshold of the CMOS transistor 10 is controlled.

Thus, the device has the effect described in the third embodiment. Further, since the PN junction is formed in the support layer 2, voltage transfer through the support layer 2 is limited.

The device shown in FIG. 7 is formed such that a step for forming the threshold control electrode 40 and a step for forming the P conductive type layer 2a or the N conductive type layer 2b are added in the steps shown in FIGS. 1A to 4B. Specifically, when a part of the SOI layer 1 and the embedded oxide film 3 are removed so that the trench separation portion 7 is formed, another part of the SOI layer 1 and the embedded oxide film 3 are also removed. The other part of the SOI layer 1 and the embedded oxide film 3 correspond to the threshold control electrode 40. Then, a part of the support layer 2 disposed under the threshold control electrode 40 is covered with a mask so that the part of the support layer 2 is not removed. When a wiring layer for connecting to the gate electrode 16a, 16b, the source region 13a, 13b or the drain region 14a, 14b is formed, the threshold control electrode 40 is also formed at the same time. In a step of forming the P conductive type layer 2a or the N conductive type layer 2b, when the support layer 2 is made of a N conductive type material, an ion is preliminarily implanted on the support layer 2 before the support layer 2 is bonded to the SOI layer 1 via the embedded oxide film 3. Thus, the P conductive type layer 2a is formed. When the support layer 2 is made of a P conductive type material, the N conductive type layer 2b is formed at the same time of the step for forming the N$^+$ conductive type drain region 26.

Fifth Embodiment

A semiconductor device according to a fifth embodiment includes a thin film structure such as a sensor.

Figure 8:
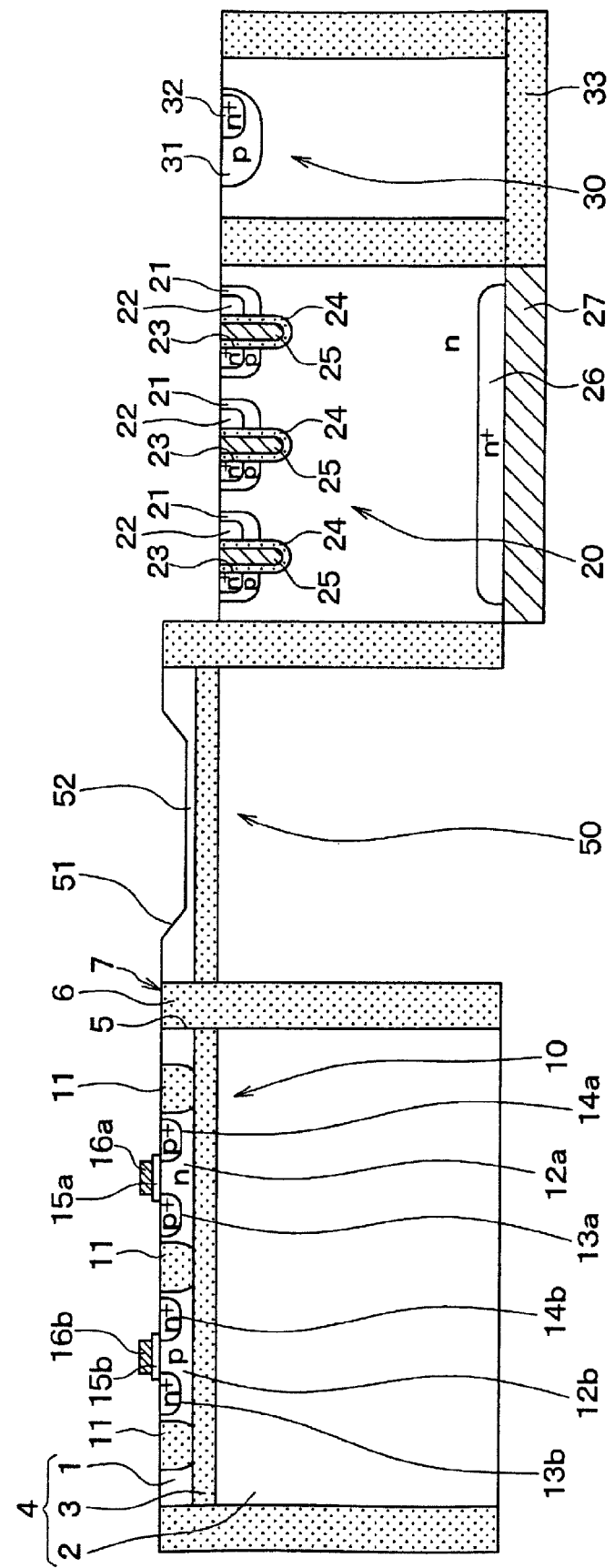
FIG. 8 is a diagram illustrating a cross sectional view of a semiconductor device according to a fifth embodiment.
Figure 9A:
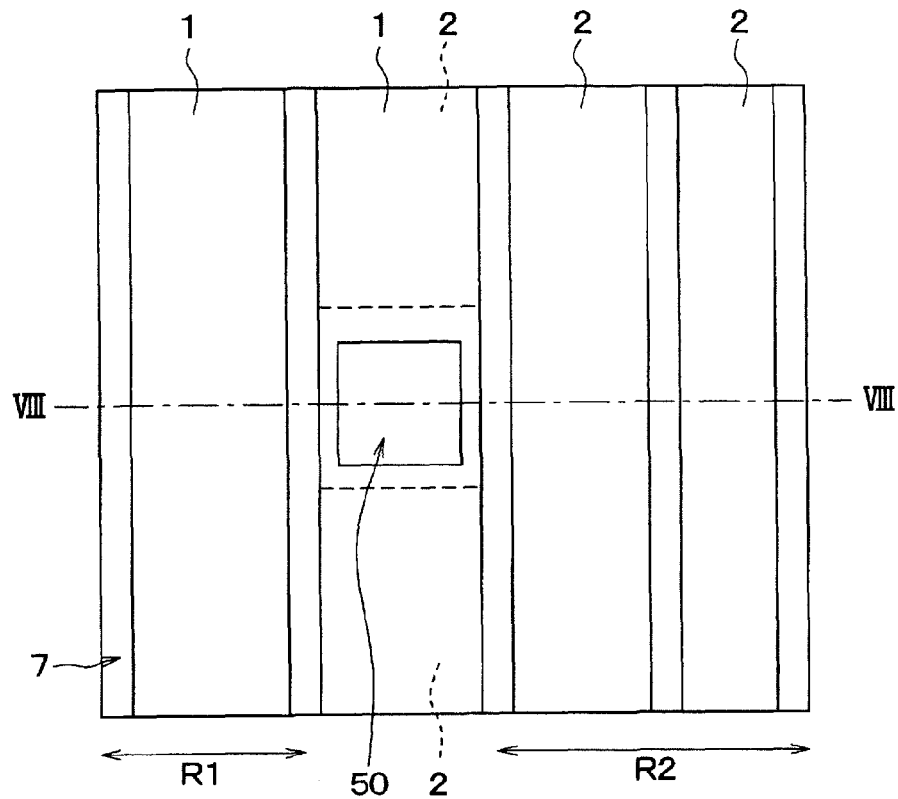
FIG. 9A is a diagram illustrating a top view of the semiconductor device according to the fifth embodiment.
Figure 9B:
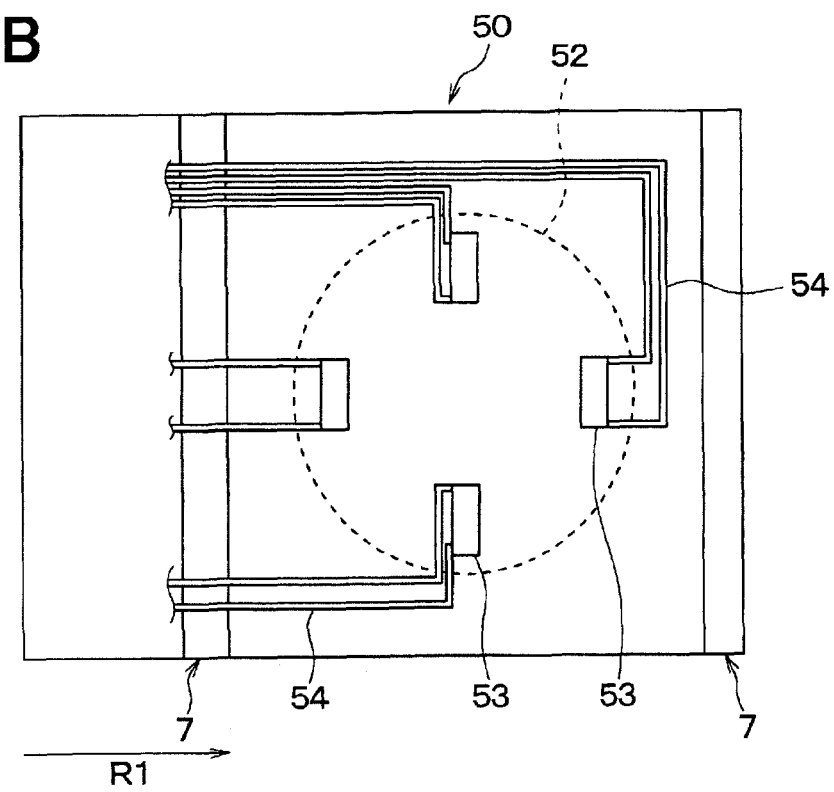
FIG. 9B is a diagram illustrating a partially enlarged top view of the device in FIG. 9A.

FIG. 8 shows the device according to the fifth embodiment. FIG. 9A shows a top view of the device, and FIG. 9B shows a part of the device. FIG. 8 is a cross sectional view of the device taken along line VIII-VIII in FIG. 9A.

In FIG. 8, a thin film structure 50 is disposed between the low power circuit portion R1 and the high power circuit portion R2. The thin film structure 50 is formed by removing the support layer 2 so that the thin film structure 50 is formed of the SOI layer 1 and the embedded oxide film 3. The thin film structure 50 is, for example, a sensor or a microphone. Specifically, the thin film structure 50 includes a concavity 51, which is formed by hollowing the surface of the SOI layer 1. Thus, The SOI layer 1 is thinned so that the concavity 51 provides a diaphragm 51, which is formed on the SOI layer 1 and the embedded oxide film 3. A piezo resistor 53 made of, for example, a p conductive type diffusion layer is formed on the diaphragm 52. When the diaphragm 52 becomes distorted by application of pressure or sound, the resistance of the piezo resistor 53 is changed in accordance with the distortion of the diaphragm 52. The thin film structure 50 provides a sensor for detecting pressure or a microphone for detecting sound based on the resistance change of the resistor 53.

In FIG. 9B, the device includes four piezo resistors 53. Each piezo resistor 53 is electrically connected to the signal processing circuit in the low power circuit portion R1 via a wiring 54. The resistance change of each piezo resistor 53 is transmitted to the signal processing circuit through the wiring 54 so that the thin film structure 50 functions as a sensor or a microphone.

The thin film structure 50 is disposed at a center of a chip of the device. Accordingly, the thin film structure 50 is surrounded with the support layer 2 so that the thin film structure 50 is prevented from being damaged. Specifically, in FIG. 9A, an upper side of the thin film structure 50 includes the support layer 2, and a lower side of the thin film structure 50 includes the support layer 2, so that the support layer 2 in the upper and lower sides is not removed.

The thin film structure 50 includes the embedded oxide film 3. Alternatively, the thin film structure 50 may have no embedded oxide film 3. Alternatively, the thickness of the embedded oxide film 3 in the thin film structure 50 may be thinned, so that sensor sensitivity increases.

Sixth Embodiment

In a semiconductor device according to a sixth embodiment, the power MOSFET transistor 20 is completely isolated from other parts of the device.

Figure 10:
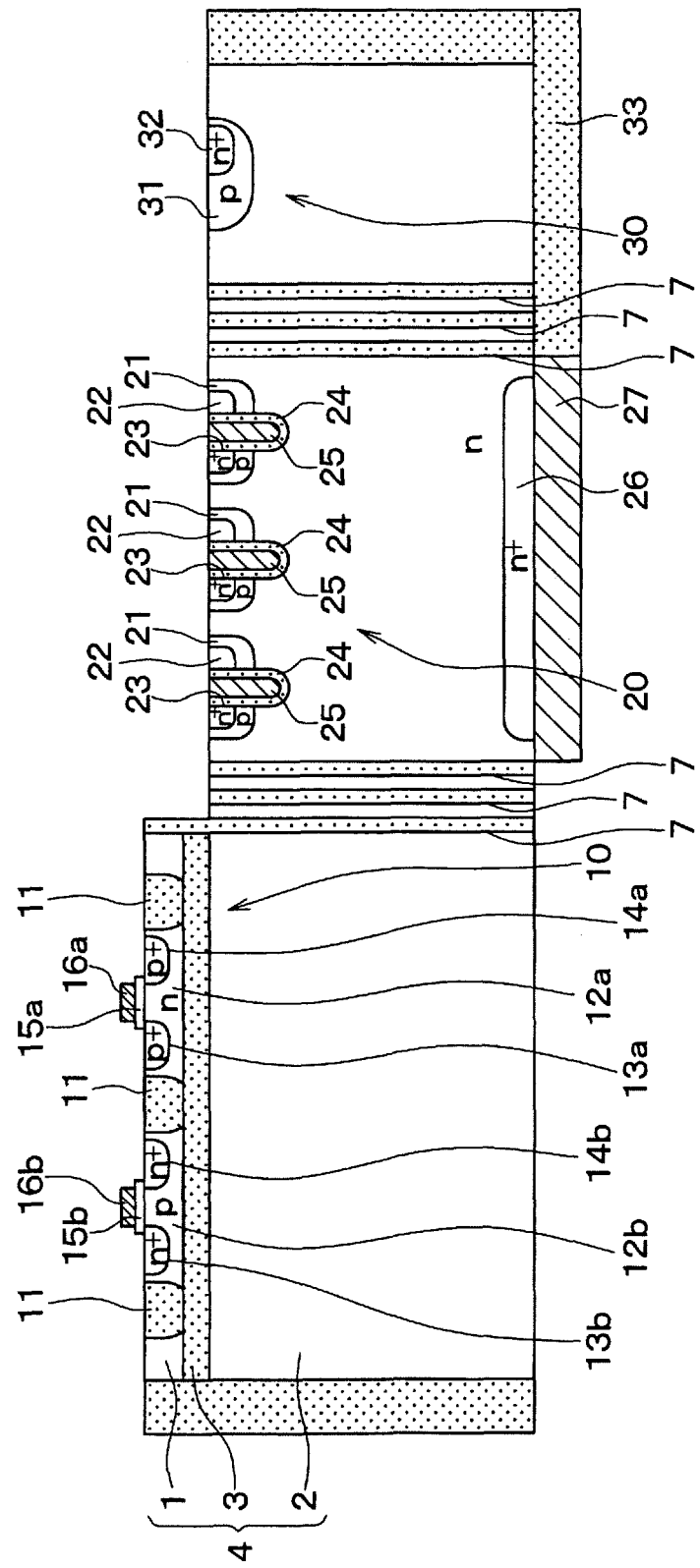
FIG. 10 is a diagram illustrating a cross sectional view of a semiconductor device according to a sixth embodiment.

FIG. 10 shows the device. The device includes multiple trench separation portions 7, which are formed between the power MOSFET transistor 20 and other parts of the device. Specifically, the trench separation portions 7 are disposed between the power MOSFET transistor 20 and the low power circuit portion R1. Further, the trench separation portions 7 are disposed between the power MOSFET transistor 20 and the protection diode 30. Thus, the device has multi-trench structure.

The power MOSFET transistor 20 is isolated and separated from other elements in the device with the multi trench structure having multiple trench separation portions 7. Thus, the power MOSFET transistor 20 is securely isolated from the other elements. The high voltage applied to the power MOSFET transistor 20 is not affected to the other elements, and thereby, electric potential interference between the power MOSFET transistor 20 and the other elements is reduced.

Seventh Embodiment

In a semiconductor device according to a seventh embodiment, the power MOSFET transistor 20 is divided into a main cell and a sensing cell.

Figure 11:
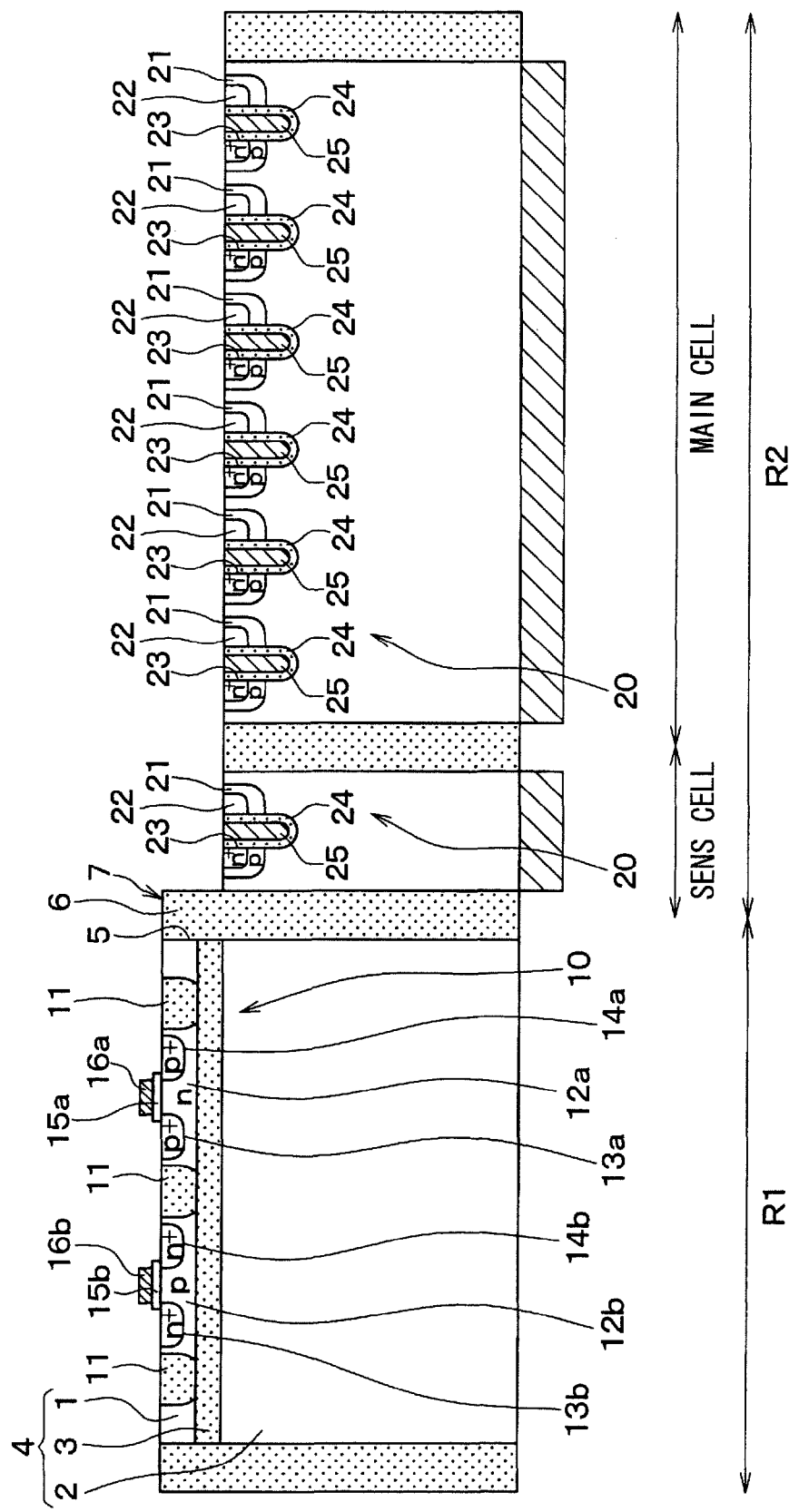
FIG. 11 is a diagram illustrating a cross sectional view of a semiconductor device according to a seventh embodiment.

FIG. 11 shows the device. The power MOSFET transistor 20 is divided to the main and sensing cells with the trench separation portion 7. The main cell includes multiple elements, and the sensing cell includes an element, which has the same structure as the element in the main cell. Alternatively, the sensing cell may include multiple elements, and the number of elements in the sensing cell is smaller than that in the main cell. A current in proportion to the large current flowing through the main cell flows through the sensing cell, so that the sensing cell detects the current. Thus, the large current flowing through the main cell is detected. The device may be used for a load driving device for supplying the large current flowing through the main cell to a load.

Even when the power MOSFET transistor 20 is divided into the main cell and the sensing cell, the effect of the device according to the seventh embodiment is the same as the first embodiment. Although the device has no protection diode 30, the device may include the protection diode 30.

Eighth Embodiment

A semiconductor device according to an eighth embodiment includes a temperature sensor.

Figure 12:
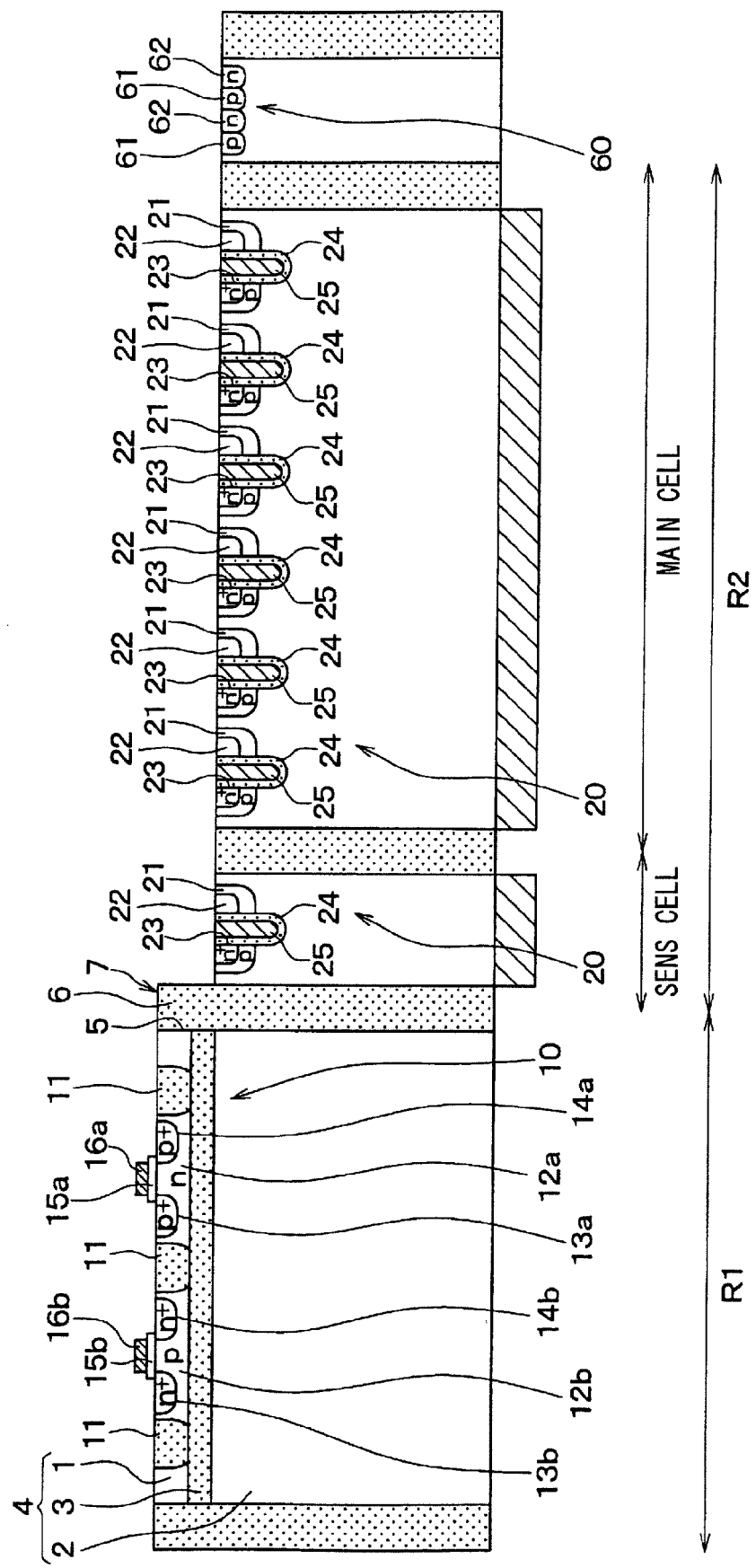
FIG. 12 is a diagram illustrating a cross sectional view of a semiconductor device according to an eighth embodiment.

FIG. 12 shows the device according to the eighth embodiment. A temperature sensor 60 is formed in the high power circuit portion R2 to be adjacent to the power MOSFET transistor 20. The temperature sensor 60 includes multiple PN diodes having a P conductive type layer 61 and a N conductive type layer 62. The temperature sensor 60 detects the temperature of the power MOSFET transistor 20 based on the temperature property of the PN diode. Based on the temperature detected by the temperature sensor 60, the power MOSFET transistor 20 is controlled to protect from excess temperature increase. Specifically, the operation state of the power MOSFET transistor 20 is controlled based on various calculation in the signal processing circuit in the low power circuit portion R1.

The temperature sensor 60 does not consume the large current. Therefore, the temperature sensor 60 may be disposed in the low power circuit portion R1. When the temperature sensor 60 is disposed in the high power circuit portion R2, the temperature sensor 60 can detect the temperature of the power MOSFET transistor 20 with high accuracy since the temperature sensor 60 is disposed near the power MOSFET transistor 20.

Even when the device includes the temperature sensor 60 for detecting the temperature of the power MOSFET transistor 20, the device according to the eighth embodiment has the same effect as the first embodiment.

Ninth Embodiment

A semiconductor device according to a ninth embodiment includes the temperature sensor 60, which is arranged at a place different from the device shown in FIG. 12.

Figure 13:
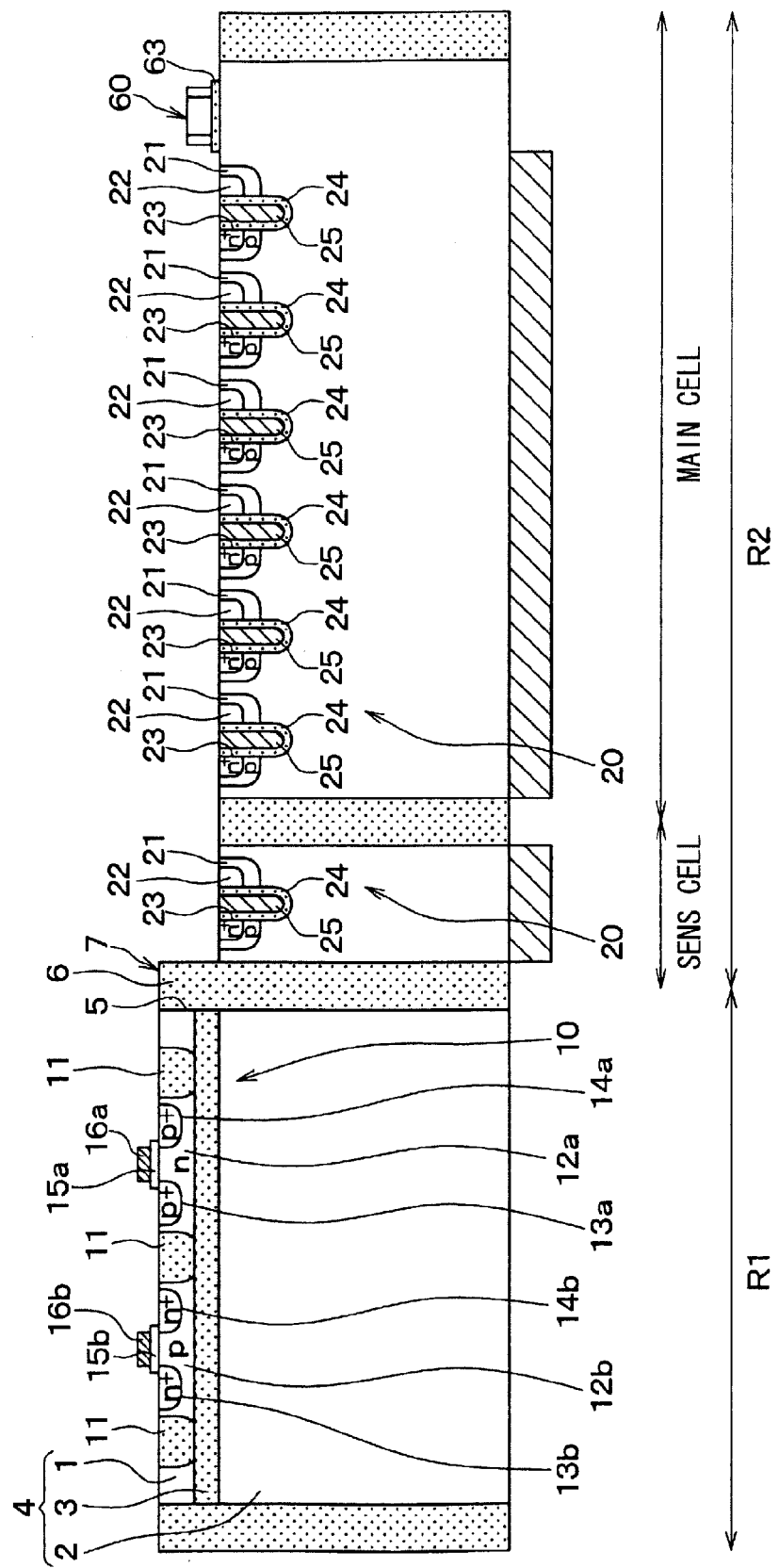
FIG. 13 is a diagram illustrating a cross sectional view of a semiconductor device according to a ninth embodiment.
Figure 14:
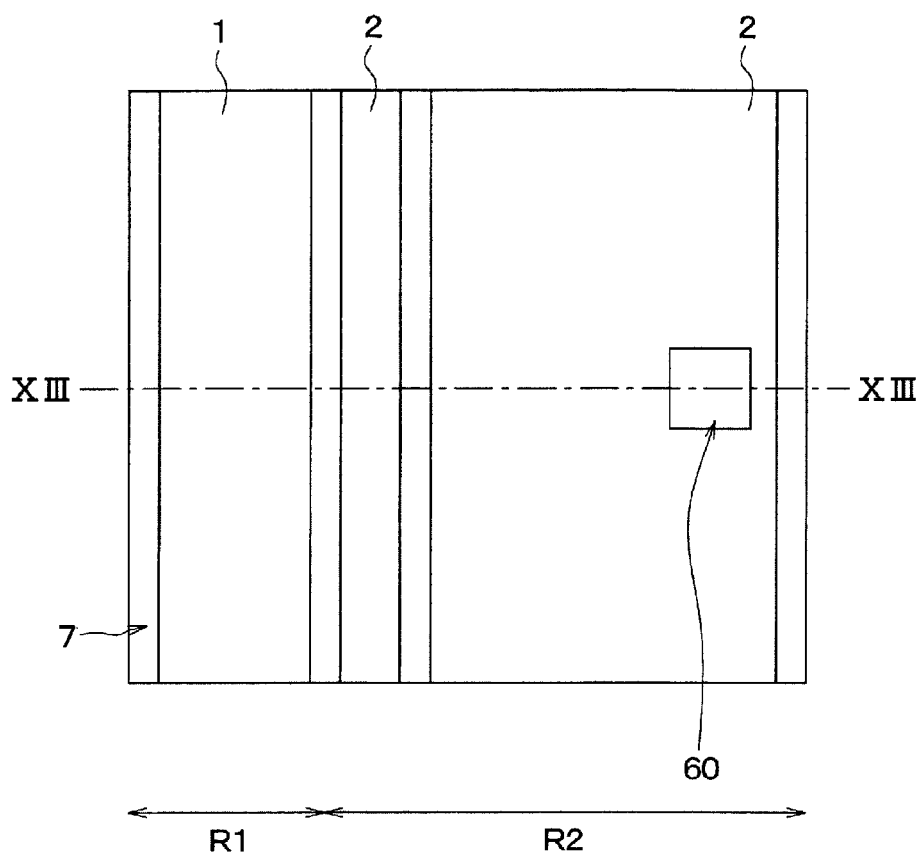
FIG. 14 is a diagram illustrating a top view of the semiconductor device according to the ninth embodiment.

FIG. 13 shows the device according to the ninth embodiment. FIG. 14 is a top view of the device. The temperature sensor 60 is disposed on the surface of the support layer 2, in which the power MOSFET transistor 20 is formed. The temperature sensor 60 is formed on the surface of the support layer 2 in the high power circuit portion R2 via an insulation film 63 such as an oxide film Even when the temperature sensor 60 is formed on the surface of the support layer 2, the device according to the ninth embodiment has the same effect as the eighth embodiment. Further, since the temperature sensor 60 is closer to the power MOSFET transistor 20 than that in FIG. 12, the temperature sensor 60 can detect the temperature of the power MOSFET transistor 20 much accurately.

Tenth Embodiment

A semiconductor device according to a tenth embodiment has a partial SOI structure. The device is not formed from a SOI substrate, a whole of which has the SOI structure.

Figure 15:
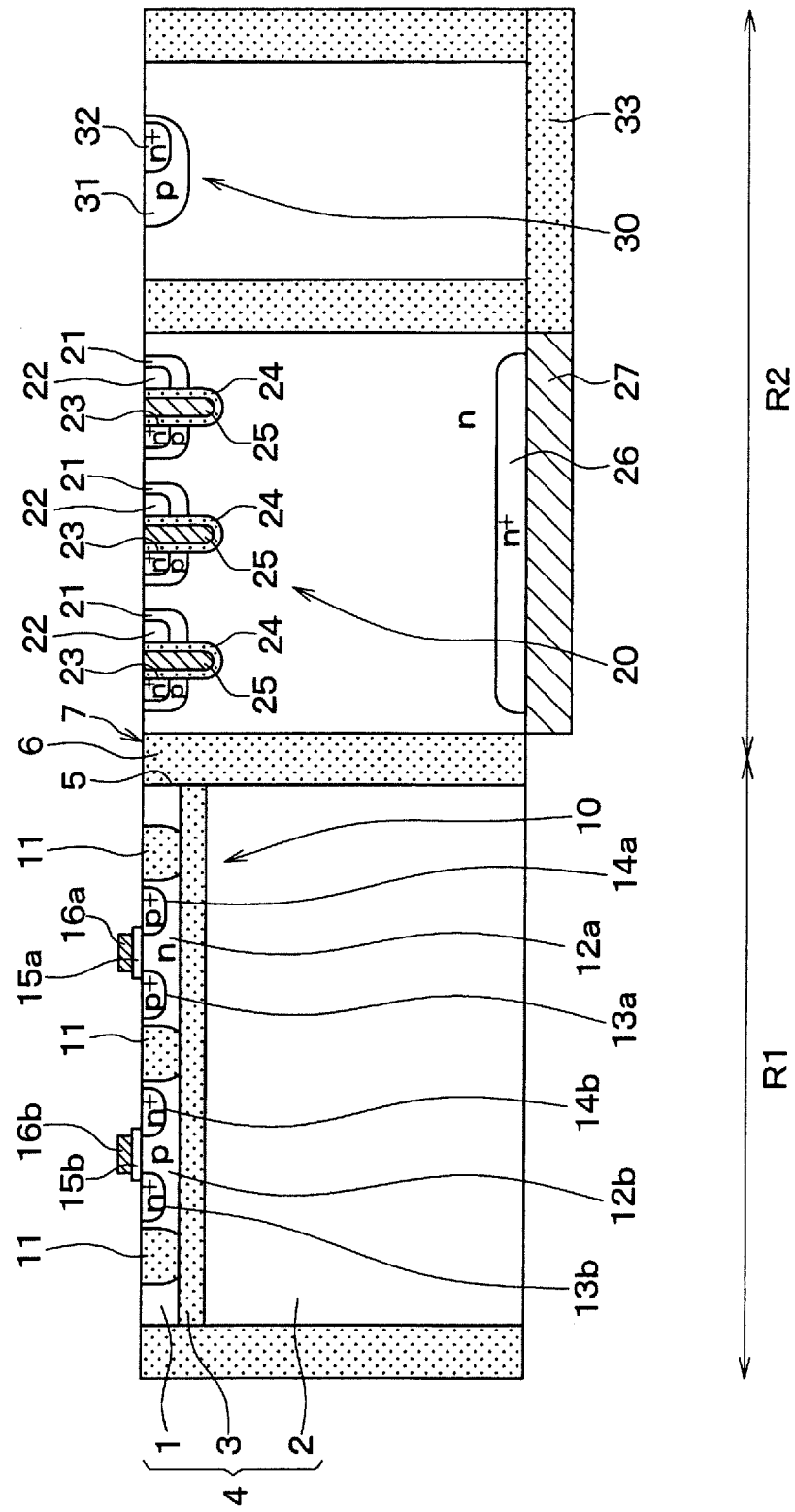
FIG. 15 is a diagram illustrating a cross sectional view of a semiconductor device according to a tenth embodiment.

FIG. 15 shows the device according to the tenth embodiment. In the first embodiment, the device has the SOI substrate 4 having the SOI structure on the whole of the substrate 4, the SOI structure including the support layer 2, the embedded oxide film 3 and the SOI layer 1 stacked in this order. In FIG. 15, the substrate 4 has the SOI structure only in the low power circuit portion R1. Accordingly, there is no step between the low power circuit portion R1 and the high power circuit portion R2, so that the surface of the low portion circuit portion R1 is disposed on the same plane as the surface of the high power circuit portion R2. Thus, the SOI substrate 4 is a partial SOI substrate having the SOI structure partially.

FIGS. 16A to 17B show a method for manufacturing the device according to the tenth embodiment.

In FIG. 16A, a silicon substrate 8 as a bulk substrate is prepared. The trench separation portion 7 is formed on the surface of the silicon substrate 8. The process for manufacturing the trench separation portion 7 in FIG. 16A is similar to that in FIG. 2B. In FIG. 16B, a region other than the low power circuit portion R1 is covered with a mask (not shown). Then, an ion such as an oxygen ion is implanted on the substrate 8 with the mask. For example, the dose amount of the ions is in a range between $1\times10^{17}$ cm$^{-3}$ and $10\times10^{17}$ cm$^{-3}$. The implantation energy is in a range between 50 eV and 500 eV. Thus, the oxygen ions are implanted at a predetermined depth from the surface of the silicon substrate 8.

Figure 17A:
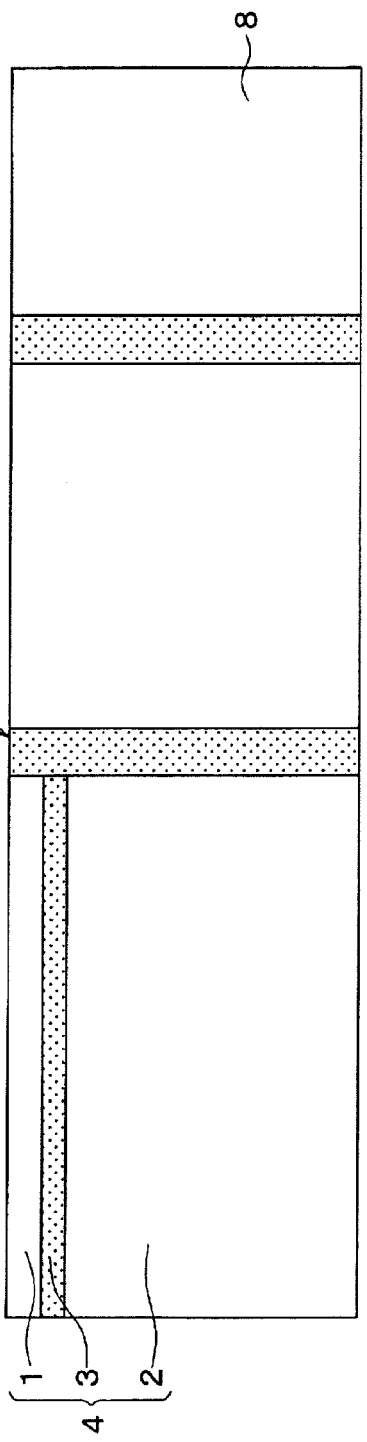
FIGS. 17A and 17B are diagrams illustrating the method for manufacturing the semiconductor device according to the tenth embodiment.

In FIG. 17A, a thermal process is performed. For example, the device is heated at a temperature in a range between 1200° C. and 1400° C. for about five hours. This thermal process provides oxidation reaction between the oxygen ions implanted in the low power circuit portion R1 and silicon in the silicon substrate 8 so that the embedded oxide film 3 is formed. The embedded oxide film 3 separates the silicon substrate 8 into two parts. The upper part of the substrate 8 provides the SOI layer 1, and the lower part of the substrate 8 provides the support layer 2. Further, the silicon substrate 8 in the high power circuit portion R1 provides the support layer 2.

Figure 17B:
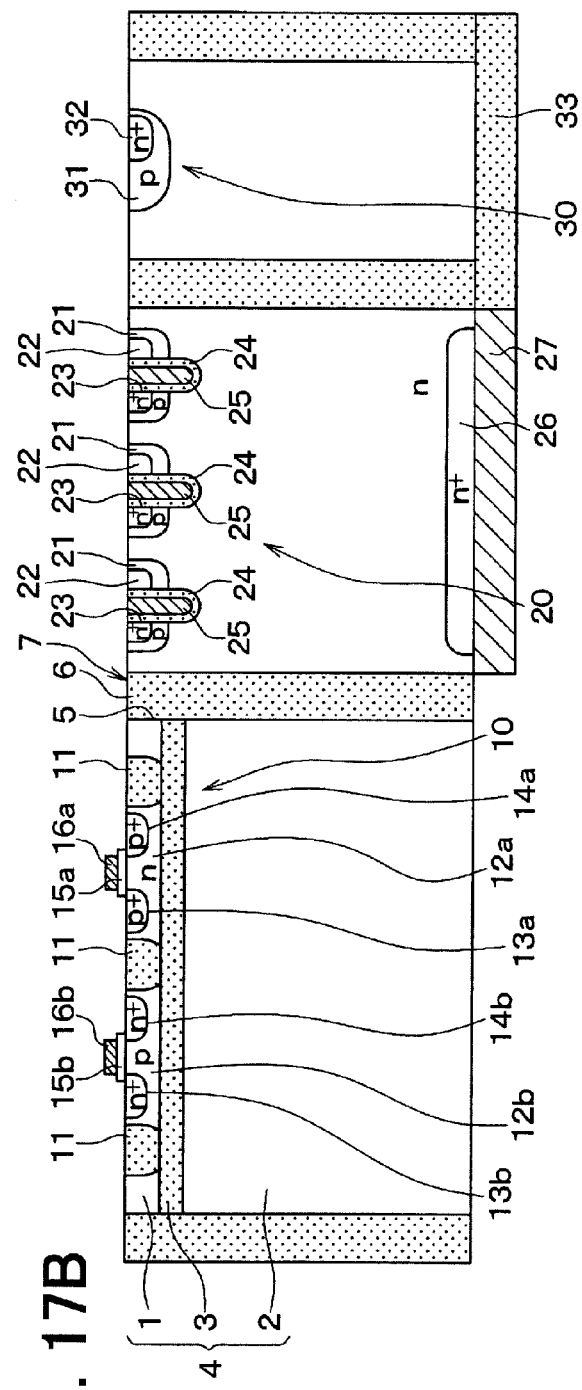

Then, the steps shown in FIGS. 3A to 4B are executed so that the device shown in FIG. 17b is completed. As shown in FIGS. 16A and 16B, the embedded insulation film 3 is formed after the trench separation portion 7 is formed. Alternatively, the trench separation portion 7 may be formed after the embedded insulation film 3 is formed.

Eleventh Embodiment

A semiconductor device according to an eleventh embodiment includes multiple embedded oxide films 3.

Figure 18:
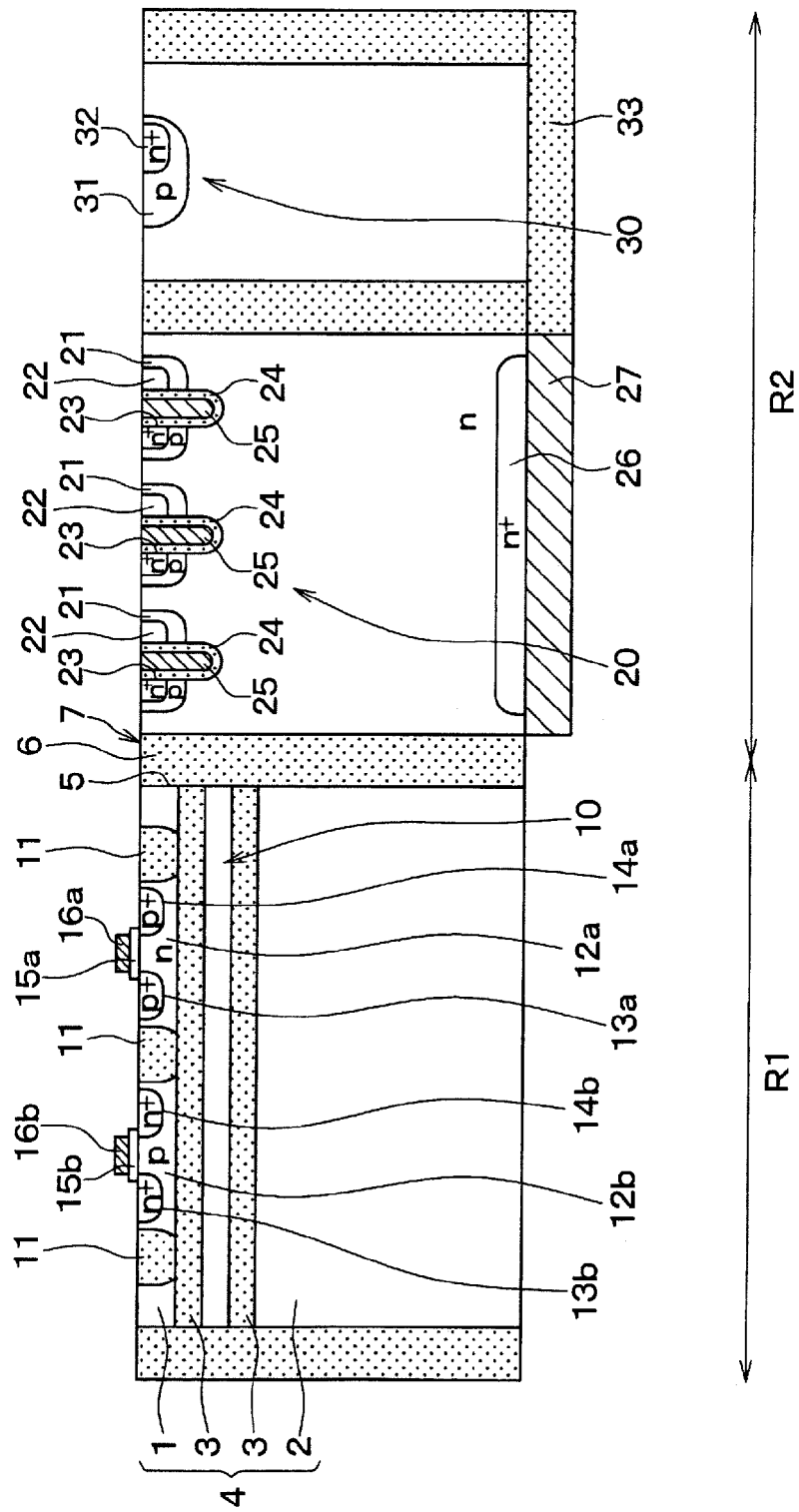
FIG. 18 is a diagram illustrating a cross sectional view of a semiconductor device according to an eleventh embodiment.

FIG. 18 shows the device according to the eleventh embodiment. The SOI substrate 4 includes two embedded oxide films 3. The total thickness of the oxide films 3 in FIG. 18 may be equal to the thickness of the embedded oxide film 3 shown in FIG. 15. In this case, the breakdown voltage of the device in FIG. 18 is substantially the same as that in FIG. 15. Alternatively, the total thickness of the oxide films in FIG. 18 may be different from that in FIG. 15.

The manufacturing method for multiple embedded oxide films 3 is such that the implantation energy of the oxygen ions in FIG. 16B is changed so that the implantation depth is controlled.

Twelfth Embodiment

A semiconductor device according to a twelfth embodiment has a power MOSFET transistor 20, which is different from that in FIG. 1.

Figure 19:
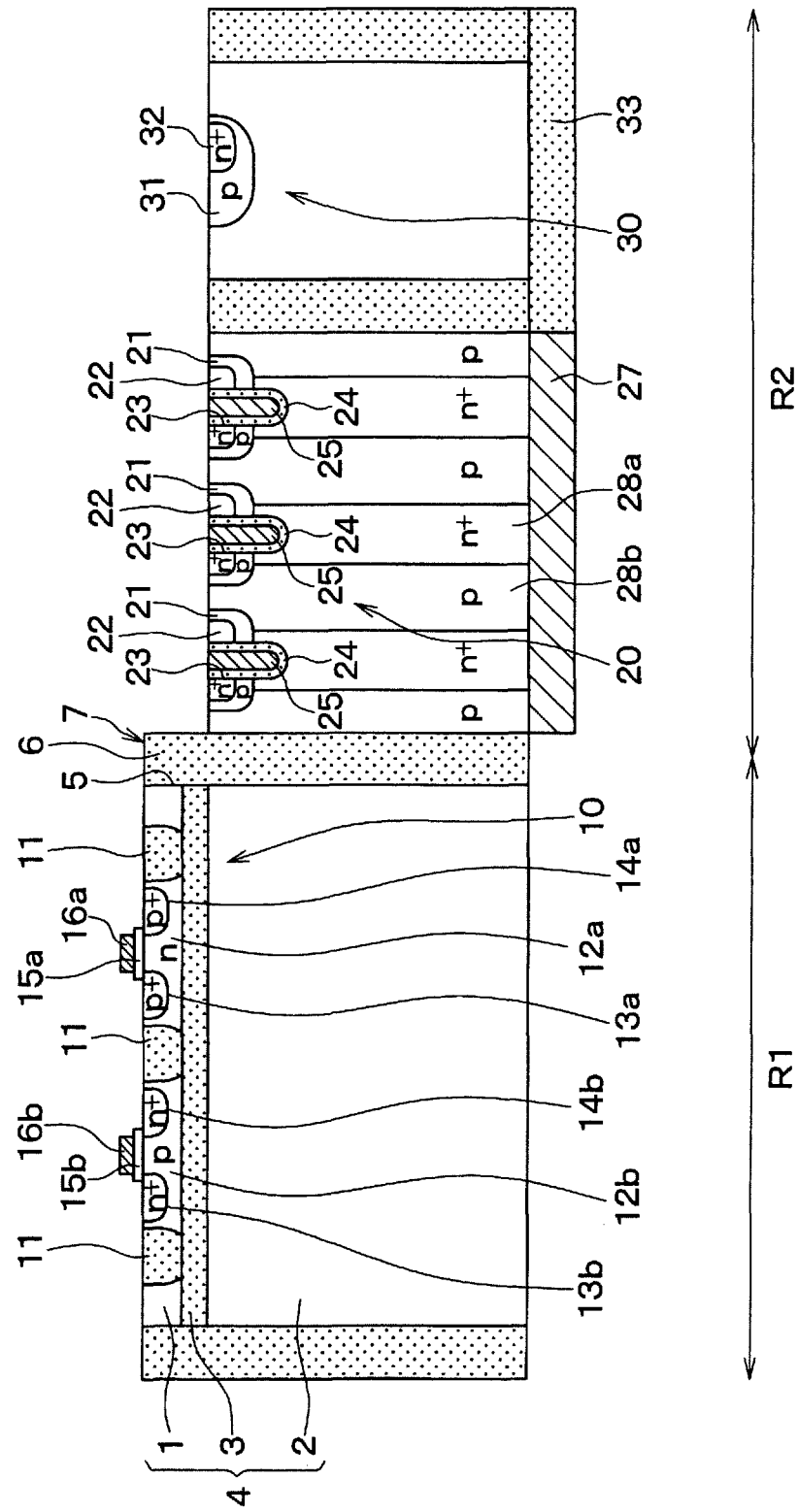
FIG. 19 is a diagram illustrating a cross sectional view of a semiconductor device according to a twelfth embodiment.

FIG. 19 shows the device according to the twelfth embodiment. The support layer 2 has a super junction structure in the high power circuit portion R2, in which the power MOSFET transistor 20 is formed. Specifically, multiple N$^+$ conductive type layers 28a and multiple P conductive type layers 28b are alternately arranged. The N$^+$ conductive type layer 28a faces the trench gate structure in the MOSFET transistor 20, so that the N$^+$ conductive type layer 28a is disposed under the N$^+$ conductive type source region 22. The P conductive type layer 28b is disposed between two trench gate structures. When the device includes the super junction structure, the breakdown voltage of the power MOSFET transistor 20 is improved. Specifically, when the power MOSFET transistor 20 is not operated, a depletion layer extending along with the PN junction between the N$^+$ conductive type layer 28a and the P conductive type layer 28b pinches off a current path, and thereby, the breakdown voltage is increased. Further, when the power MOSFET transistor 20 is operated, the depletion layer is reduced so that the current flows through the N$^+$ conductive type layer 28a, which has high impurity concentration. Thus, the device has low on-state resistance.

Thirteenth Embodiment

A semiconductor device according to a thirteenth embodiment includes various elements in each of the low and high power circuit portions R1, R2. The elements are coupled with a wiring.

Figure 20:
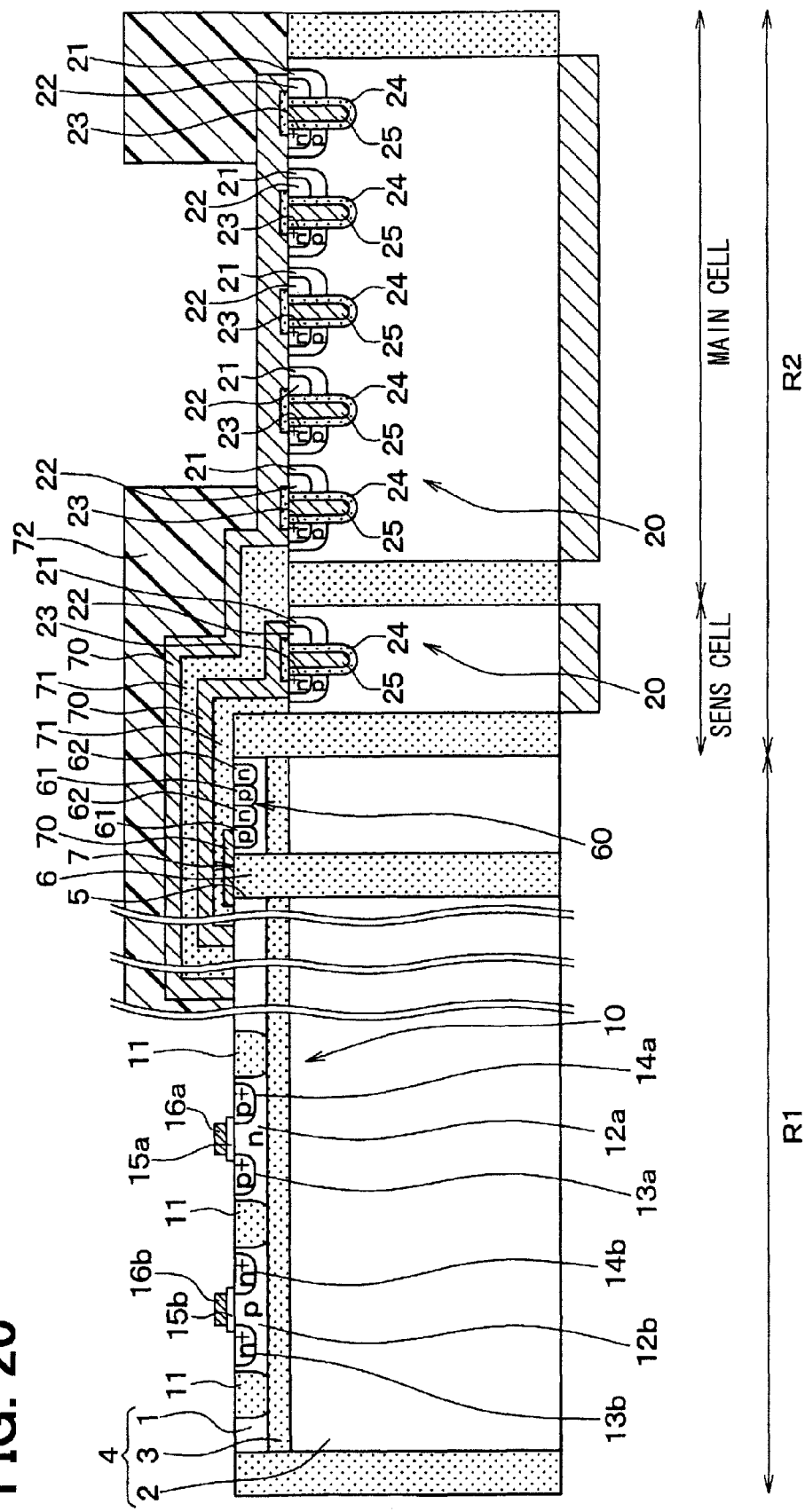
FIG. 20 is a diagram illustrating a cross sectional view of a semiconductor device according to a thirteenth embodiment.

FIG. 20 shows the device having the main cell and the sensing cell in the power MOSFET transistor 20. Further, the device includes the temperature sensor 60. FIG. 20 shows a wiring structure of the device. In the device, the temperature sensor 60 is formed in the low power circuit portion R1.

Each element isolated with the trench separation portion 7 is electrically coupled with the signal processing circuit in the low power circuit portion R1 via a pair of a wiring layer 70 and an interlayer insulation film 71. The wiring layer 70 is made of conductive material such as metal. Specifically, the wiring layer 70 is made of, for example, aluminum. The interlayer insulation film 71 is formed on the wiring layer 70. In FIG. 20, a wiring for a pair of the temperature sensor 60 and the signal processing circuit, which are coupled with each other, another wiring for a pair of the sensing cell in the power MOSFET transistor 20 and the signal processing circuit, which are coupled with each other, and further another wiring for a pair of the main cell in the power MOSFET transistor 20 and the signal processing circuit, which are coupled with each other, are provided by a three-layer structure. The wiring for the main cell, which is disposed on an upper side of the device, is provided by the wiring layer 70. The wiring layer 70 is formed on a whole area of the main cell, on which the power MOSFET transistor 20 is formed. The wiring layer 70 also functions as a source electrode for electrically coupling with the N$^+$ conductive type source region 22. A protection film 73 is formed on the wiring layer 70. The protection film 73 has an opening, through which the wiring layer 70 is exposed. The wiring layer 70 exposed from the opening of the protection film 73 provides a pad for electrically coupling with an external circuit. The pad is connected to the external circuit by a bonding method or the like.

Even when various elements are disposed in each of the low and high power circuit portions R1, R2, each element is surely connected to the signal processing circuit.

Fourteenth Embodiment

A semiconductor device according to a fourteenth embodiment includes various elements in each of the low and high power circuit portions R1, R2. The device has the wiring structure for coupling the elements with a wiring.

In FIG. 20, the device includes the three-layer structure, in which multiple wiring layers 70 and multiple interlayer insulation film 71 are stacked. However, in this embodiment, the wiring structure in the device includes only one wiring for coupling the elements and the signal processing circuit.

Figure 21:
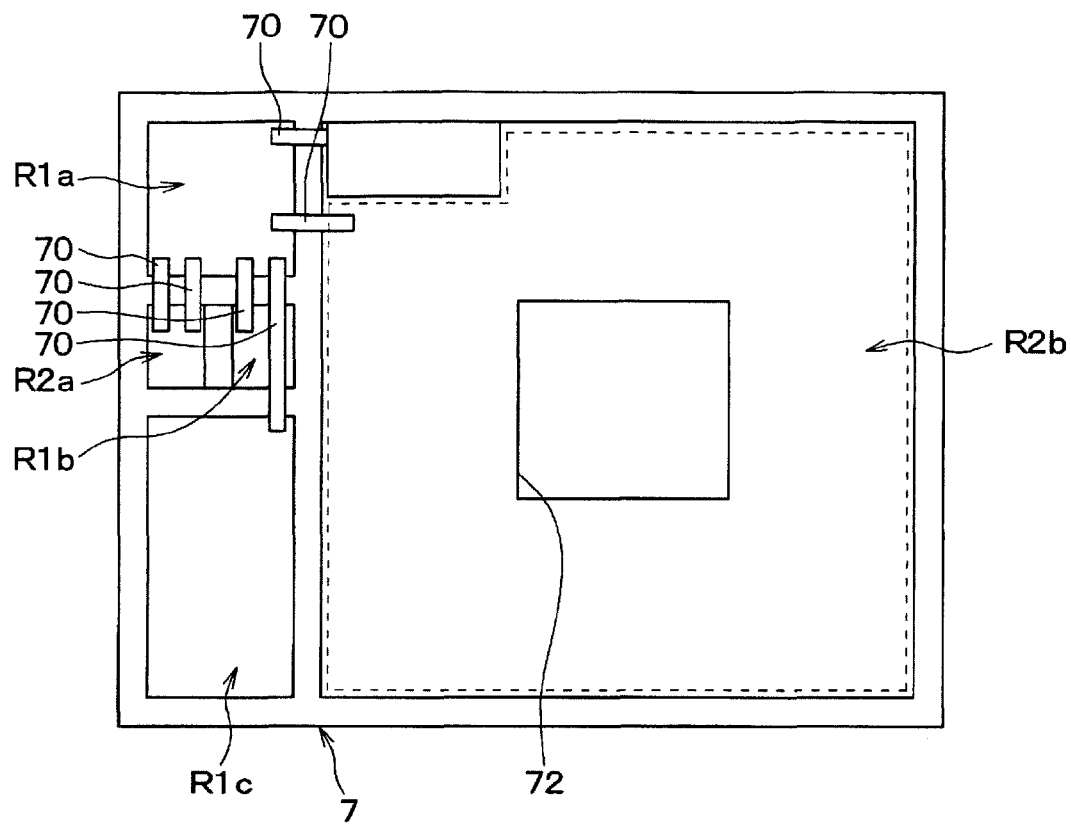
FIG. 21 is a diagram illustrating a top view of a semiconductor device according to a fourteenth embodiment.

FIG. 21 shows the device according to the fourteenth embodiment. In the device, the power MOSFET transistor 20 is divided into the main cell and the sensing cell. Further, the device includes the thin film structure 50 and the temperature sensor 60. FIG. 21 shows a wiring structure in the device.

The low power circuit portion R1 includes a first low power region R1a, in which the signal processing circuit is disposed. The portion R1 further includes a second low power region R1b, in which the temperature sensor 60 is formed. The second low power region R1b is adjacent to the first low power region R1a. The high power circuit portion R2 includes a first high power region R2a, in which the sensing cell of the power MOSFET transistor 20 is formed. The first high power region R2a is adjacent to the first low power region R1a. The portion R2 further includes a second high power region R2b, in which the main cell is formed. The portion R1 further includes a third low power region R1c, in which the thin film structure 50 is formed. The third low power region R1c and the first low power region R1a sandwich the second low power region R1b and the first high power region R2a. The third low power region R1c is opposite to the first low power region R1a.

Multiple wiring layers 70 extend from the first low power region R1a to the second low power region R1b, the third low power region R1c, the first high power region R2a and the second high power region R2b, respectively. The wiring layers 70 are not overlapped with each other. Thus, only one pair of the wiring layer 70 and the interlayer insulation film 71, which is disposed on the wiring layer 70, provide electric connection between the elements and the signal processing circuit.

Here, an area of the second high power region R2b in FIG. 21 surrounded with a dotted line provides a source electrode, which is a part of the wiring layer 70. The protection film 72 has the opening, which is disposed at the center of the area, so that the wiring layer 70 is capable of connecting to the external circuit through the opening. The other area of the second high power region R2b, which is not surrounded with the dotted line, provides the wiring layer 70 connecting to the gate electrode 25.

Other Embodiments

The signal processing circuit in the low power circuit portion R1 is provided by a CMOS transistor. Alternatively, the signal processing circuit may be provided by a bipolar transistor or the like. The element in the high power circuit portion R2 is provided by a trench gate MOSFET. Alternatively, the element in the high power circuit portion R2 may be another device such as a vertical type device and a lateral type device. When the element in the high power circuit portion R2 is a power device, the effect of the device is preferable.

In the first embodiment, the element in the low power circuit portion R1 is formed before the SOI layer 1 and the embedded oxide film 3 in the high power circuit portion R2 are removed, as shown in FIG. 3A. Alternatively, the element in the low power circuit portion R1 may be formed after the SOI layer 1 and the embedded oxide film 3 in the high power circuit portion R2 are removed.

In the first embodiment, the backside of the support layer 2 is ground after the steps shown in FIGS. 3A and 3B. Alternatively, the backside of the support layer 2 may be ground before the steps shown in FIGS. 3A and 3B.

The above embodiments may be combined with each other. For example, by combining the second, third and fourth embodiments, the device may include multiple power MOSFET transistors 20 so that the device provides a multi-channel device, and the device may further include the threshold control electrode 40 for the CMOS transistor 10. Alternatively, by combining the fifth embodiment and the second to fourth embodiments, the device may include the thin film structure 50. Further, by combining the sixth embodiment and the first to fifth embodiments, the device may include the element separation structure having multiple trenches.

The material of each of the SOI substrate 4 and the elements in the substrate 4 may be different from the above embodiments. For example, the embedded insulation film of the SOI substrate 4 is the embedded oxide film 3. Alternatively, the embedded insulation film of the SOI substrate 4 may be another insulation film.

The elements in the high power circuit portion R2 are formed on the foreside of the support layer 2. Alternatively, the elements may be formed on the backside of the support layer 2. Further, the elements in the low power circuit portion R1 also may be formed on the backside of the support layer 2.

The low power circuit portion R1 as the first region and the high power circuit portion R2 as the second region are formed in the device. Alternatively, both the low power circuit portions R1 or both the high power circuit portions R2 may be formed in the device. It is preferable that the low power circuit portion R1 is formed in the SOI layer 1, and the high power circuit portion R2 is formed in the support layer 2.

In the tenth and eleventh embodiments, the SOI substrate 4 is provided by a partial SOI substrate. Alternatively, the substrate in the second to ninth embodiments may be a partial SOI substrate having a partial SOI structure, at which the low power circuit portion R1 is formed, and the high power circuit portion R2 is formed in the support layer 2.

The above disclosure has the following aspects.

According to a first aspect of the present disclosure, a semiconductor device includes: a SOI substrate including a support layer, a first insulation film and a SOI layer; a first circuit; a second circuit; and a trench separation element. The SOI substrate further includes a first region and a second region. The first region has the support layer, the first insulation film and the SOI layer, which are stacked in this order, and the second region has only the support layer. The trench separation element penetrates the support layer, the first insulation film and the SOI layer. The trench separation element separates the first region and the second region. The first circuit is disposed in the SOI layer of the first region. The second circuit is disposed in the support layer of the second region.

In the above device, the first and second circuits are mounted in one chip without thickening the SOI layer.

Alternatively, the SOI substrate may further include a step between the first region and the second region, and a height of the step corresponds to a total thickness of the SOI layer and the first insulation film.

Alternatively, the SOI substrate may be a partial SOI substrate such that the SOI layer and the first insulation film are partially disposed in the first region. In this case, no step is formed between the first and second regions. Further, the first insulation film may include a plurality of insulation layers.

Alternatively, the first circuit may include a signal processing circuit, and the second circuit may include a high power circuit, which handles electric power higher than electric power of the signal processing circuit. Further, the high power circuit may include a power device. Further, the high power circuit may include a plurality of power devices. The trench separation element includes a plurality of separation members, which is disposed in the second region. Each separation member penetrates the support layer. The second region is divided into a plurality of second portions by the plurality of separation members, and each power device is disposed in a corresponding second portion so that the high power circuit provides a multi-channel circuit. Further, the trench separation element may include a plurality of trenches so that the trench separation element provides multi-trench separation. Further, the power device may be a vertical type power device for flowing current from a first side to a second side of the support layer. The first side of the support layer is opposite to the second side of the support layer. The second region includes a main cell and a sensing cell. The trench separation element is further disposed in the second region in such a manner that the trench separation element penetrates the support layer. The main cell is separated from the sensing cell with the trench separation element, and the sensing cell flows current, which is in proportion to current flowing through the main cell.

Furthermore, the semiconductor device may further include a temperature sensor for detecting temperature of the power device. The temperature sensor is disposed in the support layer of the second region, and the temperature sensor is separated from the power device with the trench separation element.

Furthermore, the semiconductor device may further include a temperature sensor for detecting temperature of the power device. The temperature sensor is disposed on the support layer in the second region through a second insulation film, and the temperature sensor is adjacent to the power device.

Alternatively, the semiconductor device may further include a threshold control electrode. The first circuit includes a CMOS transistor. The threshold control electrode is disposed on the support layer of the first region. The threshold control electrode is electrically coupled with the support layer, and the threshold control electrode controls a threshold of the CMOS transistor.

Alternatively, the semiconductor device may further include a threshold control electrode. The first circuit includes a CMOS transistor. The threshold control electrode is disposed in the first region. The threshold control electrode penetrates the SOI layer and the first insulation film, and reaches the support layer. The threshold control electrode is electrically coupled with the support layer. The threshold control electrode controls a threshold of the CMOS transistor, and the CMOS transistor is isolated from the threshold control electrode with a third insulation film, which is disposed in the SOI layer. Further, the support layer in the first region may further include a P conductive type layer and a N conductive type layer. The P conductive type layer and the N conductive type layer provide a PN junction, and the threshold control electrode is electrically coupled with the P conductive type layer in the support layer.

Alternatively, the semiconductor device may further include a plurality of threshold control electrodes. The trench separation element includes a plurality of separation members, which is disposed in the first region. Each separation member penetrates the support layer, the first insulation film and the SOI layer. The first region is divided into a plurality of first portions by the plurality of separation members. The first circuit includes a plurality of CMOS transistors, each of which is disposed in the SOI layer of a corresponding first portion. Each threshold control electrode is disposed on the support layer of a corresponding first portion. Each threshold control electrode is electrically coupled with the support layer, and each threshold control electrode controls a threshold of a corresponding CMOS transistor.

Alternatively, the semiconductor device may further include a thin film element disposed between the first region and the second region. The thin film element is provided by the SOI layer and the first insulation film. Further, the thin film element may include a concavity and a diaphragm. The concavity is disposed in the SOI layer so that the SOI layer is partially thinned. The diaphragm is provided by a thinned SOI layer and the first insulation film, and the thin film element is one of a sensor and a microphone.

According to a second aspect of the present disclosure, a method for manufacturing a semiconductor device includes: bonding a SOI layer, a first insulation layer and a support layer to provide a SOI substrate; forming a trench in the SOI substrate to penetrate the SOI layer and the first insulation film and to reach the support layer; filling the trench with a second insulation film to provide a trench separation element, wherein the trench separation element divides the SOI substrate into a first region and a second region; forming a first circuit in the SOI layer of the first region; removing the SOI layer and the first insulation film in the second region; and forming a second circuit in the support layer of the second region.

The above method provides the semiconductor device, in which the first and second circuits are mounted in one chip without thickening the SOI layer.

According to a second aspect of the present disclosure, a method for manufacturing a semiconductor device includes: implanting an oxygen ion into a silicon substrate as a bulk substrate; heating the silicon substrate to form an insulation film at a predetermined depth of the silicon substrate so that a SOI layer, the first insulation film and a silicon support layer provide a partial SOI substrate, wherein the partial SOI substrate includes a first region and a second region, and the first region includes the SOI layer, the first insulation film and the silicon support layer, and the second region includes only the silicon support layer; forming a trench in the partial SOI substrate to penetrate the SOI layer and the first insulation film and to reach the silicon support layer, wherein the trench is disposed between the first region and the second region; filling the trench with a second insulation film to provide a trench separation element, wherein the trench separation element divides the partial SOI substrate into the first region and the second region; forming a first circuit in the SOI layer of the first region; and forming a second circuit in the support layer of the second region.

The above method provides the semiconductor device, in which the first and second circuits are mounted in one chip without thickening the SOI layer.

Alternatively, the implanting the oxygen ion may include: implanting the oxygen ion with a first implantation energy so that the oxygen ion is implanted at a first depth of the silicon substrate; and implanting the oxygen ion with a second implantation energy so that the oxygen ion is implanted at a second depth of the silicon substrate. The first implantation energy is different from the second implantation energy so that the first depth is different from the second depth, and the heating the silicon substrate provides to form a first insulation layer at the first depth of the silicon substrate and a second insulation layer at the second depth of the silicon substrate so that the first insulation layer and the second insulation layer provide the insulation film.

While the invention has been described with reference to preferred embodiments thereof, it is to be understood that the invention is not limited to the preferred embodiments and constructions. The invention is intended to cover various modification and equivalent arrangements. In addition, while the various combinations and configurations, which are preferred, other combinations and configurations, including more, less or only a single element, are also within the spirit and scope of the invention.

What is claimed is:

1. A method for manufacturing a semiconductor device comprising:
    bonding a SOI layer, a first insulation layer and a support layer to provide a SOI substrate;
    forming a trench in the SOI substrate to penetrate the SOI layer and the first insulation film and to reach the support layer;
    filling the trench with a second insulation film to provide a trench separation element, wherein the trench separation element divides the SOI substrate into a first region and a second region;
    forming a first circuit in the SOI layer of the first region;
    removing the SOI layer and the first insulation film in the second region; and
    forming a second circuit in the support layer of the second region, wherein
    the trench penetrates the support layer so that the trench separation element penetrates a whole of the SOI substrate,
    wherein the first circuit includes a signal processing circuit,
    wherein the second circuit includes a plurality of electric elements,
    wherein the electric elements include a high power circuit, which handles electric power higher than electric power of the signal processing circuit,
    wherein the high power circuit includes an electrode, which is disposed on a backside of the second region,
    wherein the trench separation element further includes a plurality of separation members, which is disposed in the second region,
    wherein each separation member penetrates the support layer,
    wherein the second region is divided into a plurality of second portions by the plurality of separation members, and
    wherein each electric element is disposed in a corresponding second portion.

2. A method for manufacturing a semiconductor device comprising:
    implanting an oxygen ion into a silicon substrate as a bulk substrate;
    heating the silicon substrate to form an insulation film at a predetermined depth of the silicon substrate so that a SOI layer, a first insulation film and a silicon support layer provide a partial SOI substrate, wherein the partial SOI substrate includes a first region and a second region, and the first region includes the SOI layer, the first insulation film and the silicon support layer, and the second region includes only the silicon support layer;
    forming a trench in the partial SOI substrate to penetrate the SOI layer and the first insulation film and to reach the silicon support layer, wherein the trench is disposed between the first region and the second region;
    filling the trench with a second insulation film to provide a trench separation element, wherein the trench separation element divides the partial SOI substrate into the first region and the second region;
    forming a first circuit in the SOI layer of the first region;
    forming a second circuit in the support layer of the second region; and
    grinding a backside of the silicon substrate so that the trench separation element is exposed on the backside of the silicon substrate,
    wherein the first circuit includes a signal processing circuit,
    wherein the second circuit includes a plurality of electric elements,
    wherein the electric elements include a high power circuit, which handles electric power higher than electric power of the signal processing circuit,
    wherein the high power circuit includes an electrode, which is disposed on a backside of the second region,
    wherein the trench separation element further includes a plurality of separation members,
    which is disposed in the second region,
    wherein each separation member penetrates the support layer,
    wherein the second region is divided into a plurality of second portions by the plurality of separation members, and
    wherein each electric element is disposed in a corresponding second portion.

3. The method according to claim 2,
    wherein the implanting the oxygen ion includes:
    implanting the oxygen ion with a first implantation energy so that the oxygen ion is implanted at a first depth of the silicon substrate; and
    implanting the oxygen ion with a second implantation energy so that the oxygen ion is implanted at a second depth of the silicon substrate,
    wherein the first implantation energy is different from the second implantation energy so that the first depth is different from the second depth, and
    wherein the heating the silicon substrate provides to form a first insulation layer at the first depth of the silicon substrate and a second insulation layer at the second depth of the silicon substrate so that the first insulation layer and the second insulation layer provide the insulation film.

4. The method according to claim 2,
    wherein the trench penetrates the support layer so that the trench separation element penetrates a whole of the partial SOI substrate.

* * * * *